(12) United States Patent
Johnson

(10) Patent No.: US 11,995,728 B2
(45) Date of Patent: May 28, 2024

(54) SYSTEMS SUPPORTING LUMINAIRE SELECTION AND ARCHITECTURAL DESIGN

(71) Applicant: LITESWAP, INC., Gainesville, FL (US)

(72) Inventor: Julie Johnson, Gainesville, FL (US)

(73) Assignee: LITESEEKER SOLUTIONS, INC., Gainesville, FL (US)

( * ) Notice: Subject to any disclaimer, the term of this patent is extended or adjusted under 35 U.S.C. 154(b) by 742 days.

(21) Appl. No.: 17/057,491

(22) PCT Filed: May 22, 2019

(86) PCT No.: PCT/US2019/033627
§ 371 (c)(1),
(2) Date: Nov. 20, 2020

(87) PCT Pub. No.: WO2019/226837
PCT Pub. Date: Nov. 28, 2019

(65) Prior Publication Data
US 2021/0217072 A1    Jul. 15, 2021

Related U.S. Application Data

(60) Provisional application No. 62/675,474, filed on May 23, 2018.

(51) Int. Cl.
*G06Q 30/00* (2023.01)
*G06F 16/245* (2019.01)
(Continued)

(52) U.S. Cl.
CPC .......... *G06Q 50/08* (2013.01); *G06F 16/245* (2019.01); *G06Q 30/018* (2013.01);
(Continued)

(58) Field of Classification Search
CPC ..... G06F 16/245; G06F 40/18; G06Q 30/018; G06Q 30/0629
See application file for complete search history.

(56) References Cited

U.S. PATENT DOCUMENTS

| 8,484,179 B2 | 7/2013 | Tran et al. |
| 11,166,357 B2 | 11/2021 | Wallner |

(Continued)

FOREIGN PATENT DOCUMENTS

| JP | 200486514 A | 3/2004 |
| JP | 2005243306 A | 9/2005 |

(Continued)

OTHER PUBLICATIONS

Kamis, Arnold, Marios Koufaris, and Tziporah Stern. "Using an attribute-based decision support system for user-customized products online: an experimental investigation." MIS quarterly (2008): 159-177.*

(Continued)

*Primary Examiner* — Kathleen Palavecino
(74) *Attorney, Agent, or Firm* — Talem IP Law, LLP

(57) ABSTRACT

A luminaire selection and architectural design platform can provide improved access and interaction with luminaire information in the industrial lighting and architectural industry. The luminaire platform, which manages and generates dynamic data including multi-attribute information related to a variety of luminaires, can receive a request comprising luminaire information and user type; and determine one or more luminaires satisfying one or more criterion with respect to the luminaire information. The luminaire platform can determine a set of attributes based on user type (e.g., attributes a user can access based on user type). The luminaire platform can obtain attributes of the set of attributes for each of the one or more luminaires; and provide the one or more luminaires and the associated set of attributes for (Continued)

display. Comparisons of luminaires and their associated set of attributes are possible through the luminaire platform's ability to convert luminaire information into consistent formats and terminology.

20 Claims, 21 Drawing Sheets

(51) Int. Cl.
| | |
|---|---|
| *G06Q 30/018* | (2023.01) |
| *G06Q 30/0601* | (2023.01) |
| *G06Q 50/08* | (2012.01) |
| *G06F 30/13* | (2020.01) |
| *G06F 40/18* | (2020.01) |
| *G06Q 10/10* | (2023.01) |
| *G06Q 10/101* | (2023.01) |

(52) U.S. Cl.
CPC ......... *G06Q 30/0629* (2013.01); *G06F 30/13* (2020.01); *G06F 40/18* (2020.01); *G06Q 10/101* (2013.01); *G06Q 10/103* (2013.01)

(56) References Cited

U.S. PATENT DOCUMENTS

| | | |
|---|---|---|
| 2004/0117355 A1 | 6/2004 | Lef et al. |
| 2011/0225139 A1* | 9/2011 | Wang ................. G06F 16/9535 707/711 |
| 2012/0323738 A1* | 12/2012 | Gokturk ................ G06Q 30/02 705/26.63 |

FOREIGN PATENT DOCUMENTS

| | | |
|---|---|---|
| TW | 200805195 A | 1/2008 |
| WO | 2016/180713 A1 | 11/2016 |
| WO | 2018167241 A1 | 9/2018 |

OTHER PUBLICATIONS

"LUMsearch Partnership Present luminaires in the search engine." Retrieved on: Apr. 5, 2019, 16 pages, Retrieved from: https://www.dial.de/en/dialux/lumsearch/lumsearch-for-manufacturers/.

"Lightsearch.com The source of lighting specifiers and buyers" Retrieved on: Apr. 5, 2019, 16 pages, Retrieved from: https://www.lightsearch.com/pdf/2019_media-kit.pdf.

"Architonic Interior Lighting" Retrieved on: Apr. 5, 2019, 5 pages, Retrieved from:https://www.architonic.com/en.

International Search Report and Written Opinion issued in International Application No. PCT/US19/33627, dated Aug. 15, 2019, 8 pages.

* cited by examiner

Figure 1B:
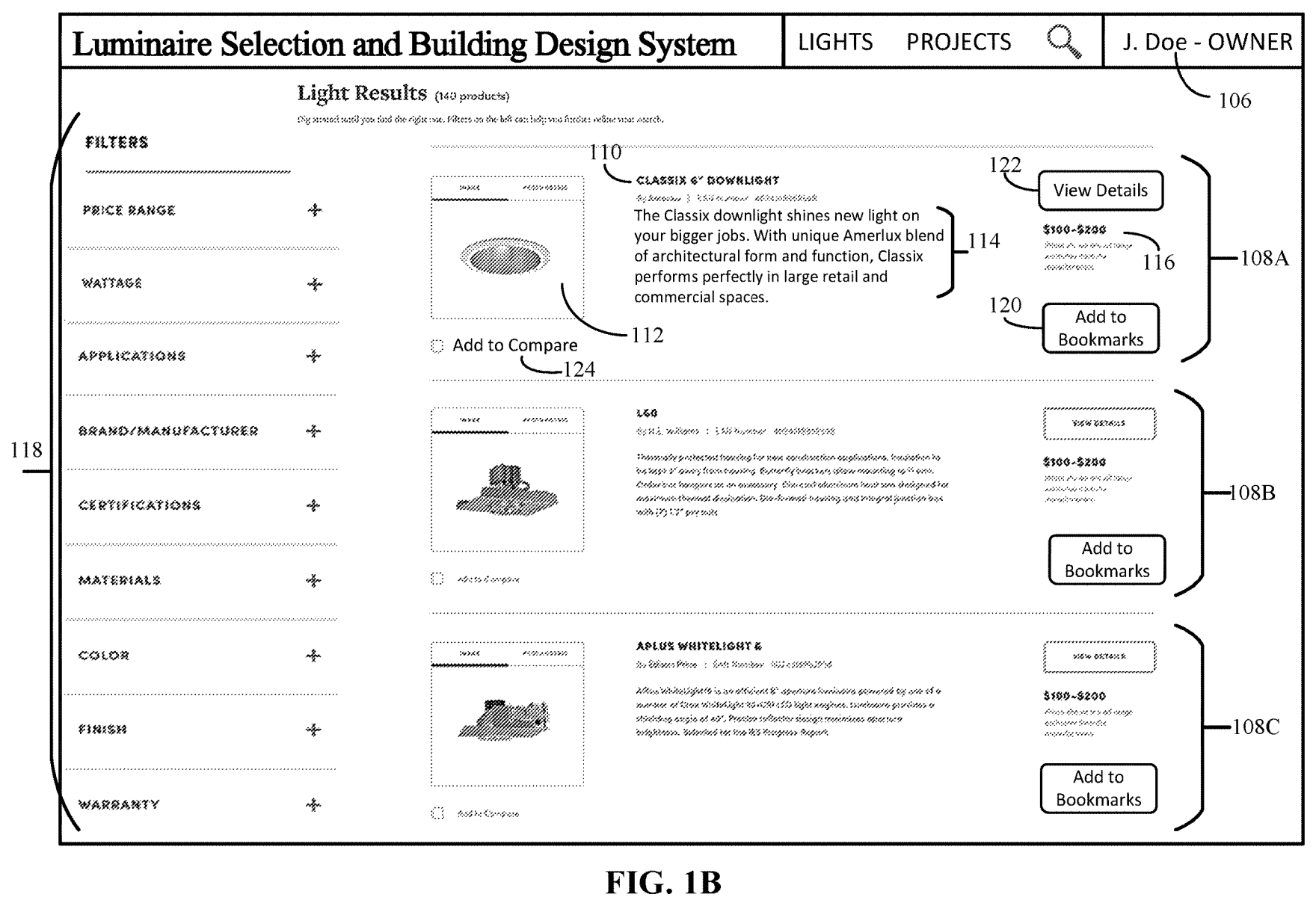

Luminaire Selection and Building Design System

LIGHTS | PROJECTS | 🔍 | J. Doe - OWNER

Light Results (140 products)

FILTERS

- PRICE RANGE
- WATTAGE
- APPLICATIONS
- BRAND/MANUFACTURER
- CERTIFICATIONS
- MATERIALS
- COLOR
- FINISH
- WARRANTY

CLASSIX 6" DOWNLIGHT

The Classix downlight shines new light on your bigger jobs. With unique Amerlux blend of architectural form and function, Classix performs perfectly in large retail and commercial spaces.

$100-$250

View Details | Add to Bookmarks

○ Add to Compare

LGO

$100-$250

View Details | Add to Bookmarks

○ Add to Compare

APLUX WHITELIGHT 6

$150-$200

View Details | Add to Bookmarks

○ Add to Compare

Luminaire Selection and Building Design System

LIGHTS | PROJECTS | 🔍 | K. JONES - DESIGNER

3. Add Lights to Group

Florida Hospital

SCHEDULE B — 366

Name this Group

ADD TO GROUP

{ EMERGENCY ROOM — 370

OPERATING ROOM — ADD TO GROUP

LABORATORY — ADD TO GROUP

DINING HALL — ADD TO GROUP

SCHEDULE B2 — 368

Name this Group

GROUP 05 — ADD TO GROUP

GROUP 06 — ADD TO GROUP

GROUP 07 — ADD TO GROUP

GROUP 08 — ADD TO GROUP

ADDING THESE WILL COST:

+$1,500~$1,900

To add lights to groups, click on all groups that apply or

EDIT LIST OF LIGHTS

SKIP THIS STEP

FIG. 3F

SYSTEMS SUPPORTING LUMINAIRE SELECTION AND ARCHITECTURAL DESIGN

CROSS-REFERENCE TO RELATED APPLICATIONS

This application is the U.S. National Stage Application of International Application No. PCT/US19/33627, filed May 22, 2019, which claims the benefit of U.S. Provisional Patent Application Ser. No. 62/675,474, filed May 23, 2018, which are hereby incorporated by reference in their entirety.

BACKGROUND

Individuals involved in the planning, design, and construction of architectural spaces are forced to rely on multiple resources in order to obtain all the data they need to purchase lighting and design a space. There is a need for designers, construction managers/contractors, owners, lighting representatives and, lighting distributers to have all needed information for lighting fixtures and luminaires at their immediate disposal in an actionable and dynamic format.

BRIEF SUMMARY

Systems supporting luminaire selection and architectural design are provided. The described luminaire selection and architectural design platform ("luminaire platform") can provide improved access and interaction with luminaire products and systems data in the industrial lighting and architectural industry. The luminaire platform can manage and generate dynamic data including information related to a variety of luminaires.

The luminaire platform can receive a request. The request can comprise luminaire information and a user type. The luminaire platform can determine one or more luminaires satisfying one or more criterion with respect to the luminaire information. The luminaire platform can determine a set of attributes based on the user type. The set of attributes can include attributes a user can access based on the user type. The luminaire platform can obtain the attributes of the set of attributes for each of the one or more luminaires; and provide the one or more luminaires and the associated set of attributes for display.

Comparisons of luminaires and their associated set of attributes are possible through the luminaire platform's ability to convert luminaire information, including photometric data file formats, into consistent formats and terminology.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 1A-1C illustrate an example scenario for luminaire selection and architectural design according to an example embodiment of the invention.

FIGS. 2A-2K illustrate an example scenario for luminaire selection and architectural design according to an example embodiment of the invention.

FIGS. 3A-3G illustrate an example scenario for luminaire selection and architectural design according to an example embodiment of the invention.

DETAILED DESCRIPTION

Figure 1A:
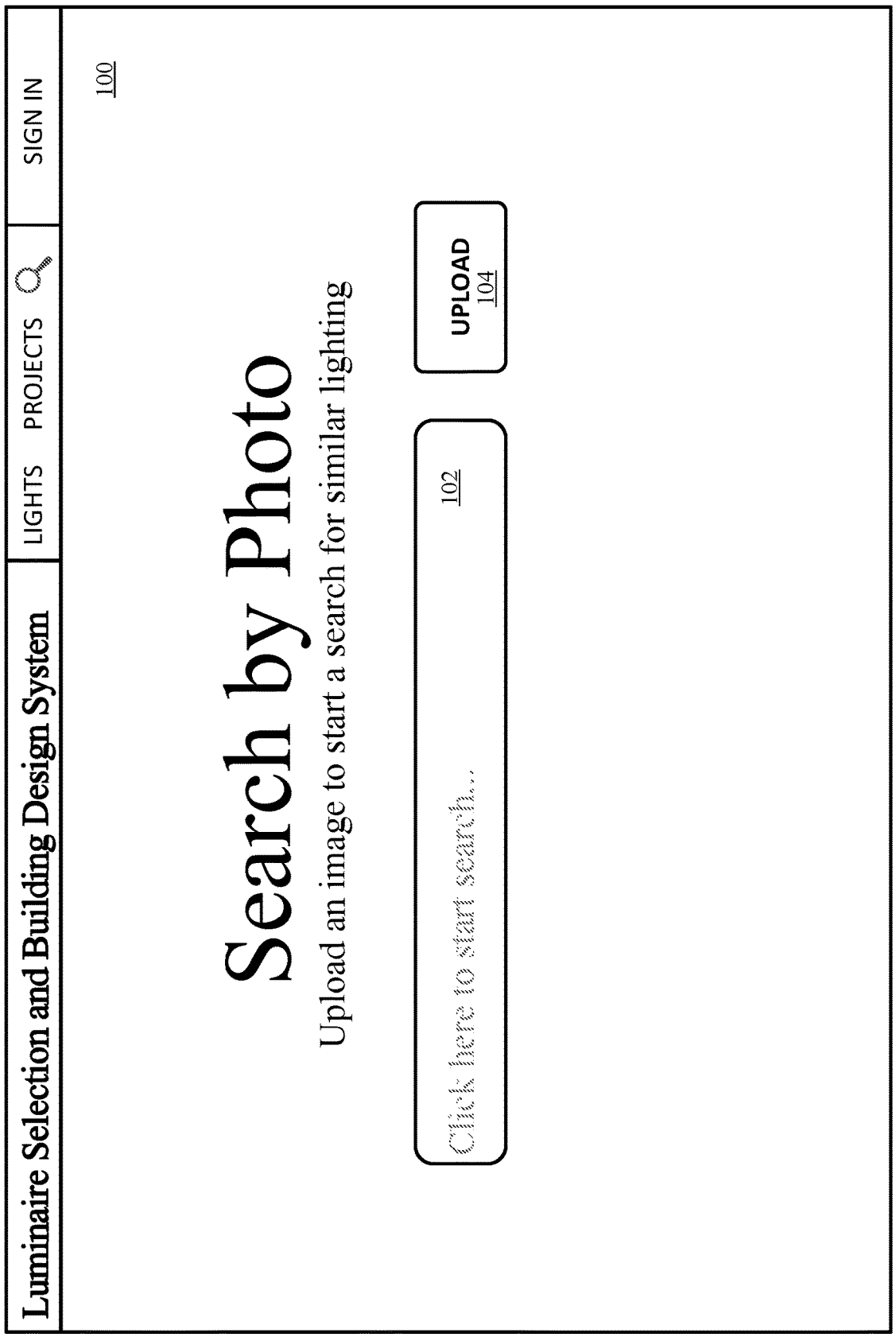

Systems supporting luminaire selection and architectural design are provided. The described luminaire platform can provide improved access and interaction with luminaire products and systems data in the industrial lighting and architectural industry. The luminaire platform can manage and generate dynamic data including information related to a variety of luminaires. Certain attributes can be prioritized based on a user type; and the luminaire platform can personalize the data that is retrieved for the user using the prioritized attributes.

The luminaire platform can receive a request. The request can comprise luminaire information and a user type. The luminaire platform can determine one or more luminaires satisfying one or more criterion with respect to the luminaire information. The luminaire platform can determine a set of attributes based on the user type. The set of attributes can include attributes a user can access based on the user type. The luminaire platform can obtain the attributes of the set of attributes for each of the one or more luminaires; and provide the one or more luminaires and the associated set of attributes for display.

Comparisons of luminaires and their associated set of attributes are possible through the luminaire platform's ability to convert luminaire information, including photometric data file formats, into consistent formats and terminology.

It should be noted that the terms "luminaire" and "lighting fixture" are used interchangeably herein.

The industrial lighting and architectural industry is dependent on disparate modalities with varying speed and accuracy. The current system in place includes an outdated supply chain that includes several middlemen with bias and limited capabilities. These systems do not keep up with the pace of changing products and technology or the need for instant data on fast-paced construction projects. For example, larger manufacturers change products and lighting representatives during the design dropped cycle of a building and the designer, contractors, and owners are left with inferior options, cost overages, and missed deadlines.

Advantageously, the luminaire platform provides users access to lighting products, fixtures, and technical specifications from various manufacturers around the globe. In many cases, the luminaire platform can eliminate the existing and archaic research process of "old school" sales channels with outdated and disparate websites, printed catalogs from manufacturers, and countless networks of global sales representatives.

Each user may be categorized into a user type based on their role in the lighting/luminaire industry. The user types can include, but are not limited to, architects, interior designers, lighting designers, landscape architects, engineers, design/builders, general contractors, electrical contractors, electrical distributors, lighting representative agencies, building owners and lighting manufacturers. In some cases, user types are split into categories: specifiers (e.g., architects, interior designers, lighting designers, landscape architects, engineers, design/builders), contractors (e.g., design/builders, general contractors, electrical contractors), owners (e.g., building owners), distributors (e.g., luminaire distributors) and manufacturers (e.g., luminaire manufacturers, lighting representative agencies).

The user type is used by the luminaire platform to identify priorities for the information (e.g., attributes), ranking and sorting of results, and information access. For example, priorities for an architect may be aesthetics first, then performance and physical parameters, and cost last. Whereas, the priorities for a general contractor may be physical parameters for mounting the luminaire first and then the cost. It should be noted, the priorities assigned for each user type may be modified based on user feedback provided to the luminaire platform.

Advantageously, unlike conventional searches, where the user type is not taken into account, the luminaire platform offers access to users that is tailored for each specific user type to increase efficiency and productivity.

As an illustrative example, contractors can utilize the luminaire platform to help create accurate estimates and bids for each project. Speed and accuracy is often very important to contractors because they are always on a tight schedule and tight budget with each project. Thus, contractors must be able to understand the quality, details, and installation information of a product quickly and efficiently. However, standards are not defined and followed across the industry. Using the luminaire platform, contractors can streamline the process of finding true product equals and getting alerts on discontinued products, which helps prevent issues during construction and can maintain the integrity of the design. The luminaire platform can help contractors to assess time and materials needed for installation per luminaire type on a project. For example, "lead" or "delivery time" for luminaire products can be provided to help with tight project schedules and limited "lay down" locations on small construction sites.

As another illustrative example, interior designers and architects can use the luminaire platform to help parse through the many available light fixtures to meet design needs. Speed is often also very important to architects and designers, thus, they must be able to quickly define the quality and performance difference between or among luminaires. There are so many new products coming to market and it is hard to determine which products are of good quality and which are not, as standards are not defined and followed across the industry. For example, initial lighting design may start with known products and then architects and designers can access the luminaire platform to be able to efficiently search for luminaires that are similar to their known products. Using the luminaire platform, architects and designers can streamline the process of finding true equals and getting alerts on discontinued products, which helps prevent or minimize issues during construction, while maintaining the integrity of the design.

FIGS. 1A-1C, FIGS. 2A-2K, and FIGS. 3A-3G illustrate example scenarios for luminaire selection and architectural design according to example embodiments of the invention. A user may access a luminaire platform on their computing device (embodied, for example, as system 600 described with respect to FIG. 6). The computing device can be any computing device such as, but not limited to, a laptop computer, a desktop computer, a tablet, a personal digital assistant, a smart phone, a smart television, a gaming console, wearable device, and the like.

The user may first be asked to sign in to access the luminaire platform. Access to the data within the luminaire platform can be based on a user type of the user. Therefore, the user experience within the luminaire platform may be different for each user according to their user type.

Figure 1C:
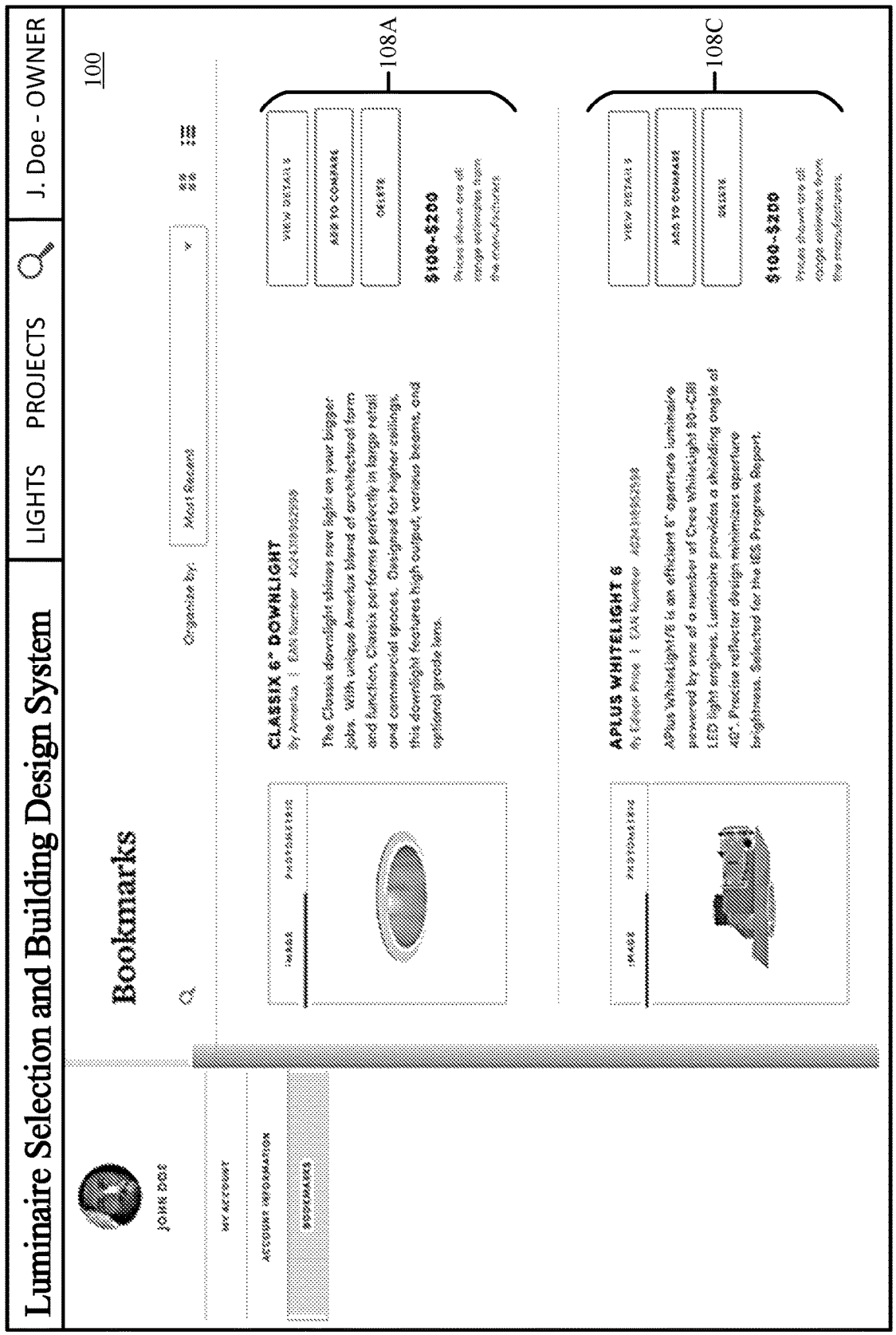

The luminaire platform provides a user with multiple ways to input luminaire information in order to search for similar luminaires. The following example scenarios are only some of the many ways to input luminaire information. In particular, FIGS. 1A-1C illustrate an example scenario where the user input is an image of a luminaire. FIGS. 2A-2K illustrate an example scenario where the user input is one or more selected attributes. FIGS. 3A-3G illustrate an example scenario where the user input is photometric data from a photometric file. It should be noted that each user type may access the luminaire platform and input luminaire information in any of the multiple ways described.

Referring to FIG. 1A, a user may open a graphical user interface (GUI) 100 of the luminaire platform on their computing device to begin a luminaire search. In the illustrative example, the user is presented with a file upload field 102 and an upload command 104 within the GUI 100. The user can upload an image of a luminaire in order to conduct a search for one or more luminaires satisfying matching criteria with respect to the luminaire in the image.

In an example, a building owner may manage multiple luminaires in a building. The owner may use the luminaire platform to help manage the luminaires by searching for information on each of the luminaires, such as installation information, product information, product updates and replacement information (e.g., replacement parts or similar luminaires), and pricing and purchasing information. For example, the owner can take a picture of a luminaire and upload the image to the luminaire platform.

Referring to FIG. 1B, the user has signed on as J. Doe (a building owner), as denoted in the user information field 106, and has uploaded an image of a luminaire, such as described in FIG. 1A. In the illustrative example, the user is presented with three luminaire results 108 (e.g., luminaire 108A, luminaire 108B, and luminaire 108C) that match the luminaire in the uploaded image.

Each of the luminaire results 108 are presented along with one or more associated attributes. These attributes are tailored to the user type, and the attributes presented for one user type may be different than the attributes presented for another user type.

In the illustrative example of FIG. 1B, since the user is an owner, attributes such as name 110, image 112, description 114, and price range 116 are displayed to the user. It should be understood that more or fewer attributes may be presented for an owner user type.

The user may further refine the results by selecting one or more filters, such as filters 118. In the illustrative example, the filters 118 provided for the owner user type include a price range, wattage, applications, brand/manufacturer, certifications, materials, color, finish, and warranty. It should be understood that more or fewer filters may be provided for the owner user type. It should also be noted the filters available for the owner user type may be different than the filters available for a different user type, such as a designer user type.

Each of the luminaire results 108 can include one or more commands, such as add to bookmarks command 120 that allows the user to add a luminaire to the bookmarks page, a view details command 122 that allows that user to view additional attributes associated with the luminaire, and an add to compare command 124 that allows the user to compare attributes of multiple luminaires.

Referring to FIG. 1C, once a user adds one or more luminaires to the bookmark page, the user can view the saved luminaires at any point in time by accessing the bookmarks page. For example, the bookmark page may be used when a user wants quick access to the luminaires that they use the most often.

In the illustrative case, the user added luminaire 108A and luminaire 108C to the bookmarks page. When the user navigates to the bookmarks page, both luminaire 108A and luminaire 108C are displayed in the GUI 100.

Figure 2A:
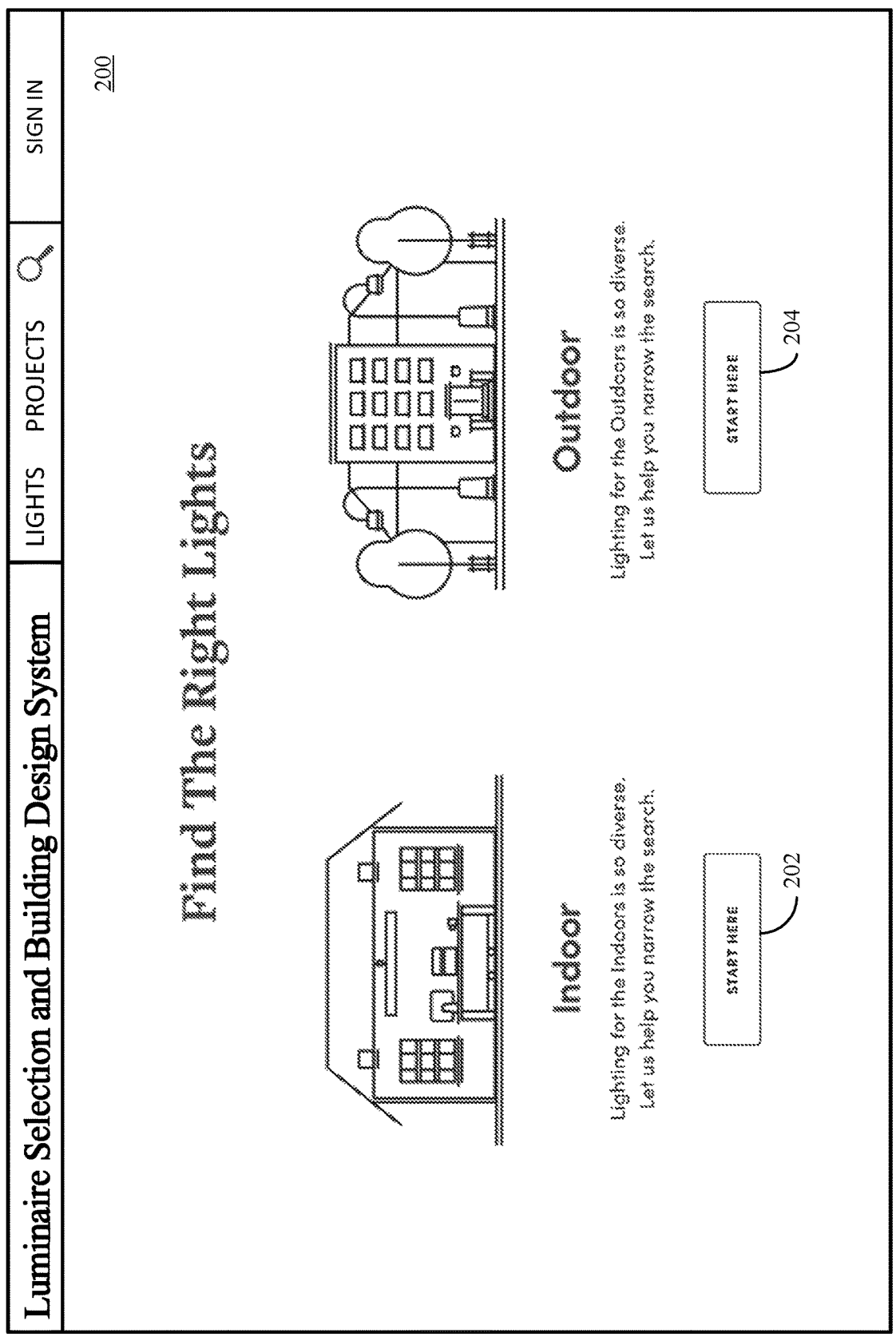

Referring to FIG. 2A, in another example scenario for beginning a search, a user may view a graphical user interface (GUI) 200 of the luminaire platform on their computing device with a filter search. In the illustrative example, the user is presented with an option to search for indoor luminaires via an indoor command 202 or outdoor luminaires via an outdoor command 204 within the GUI 200.

Figure 2B:
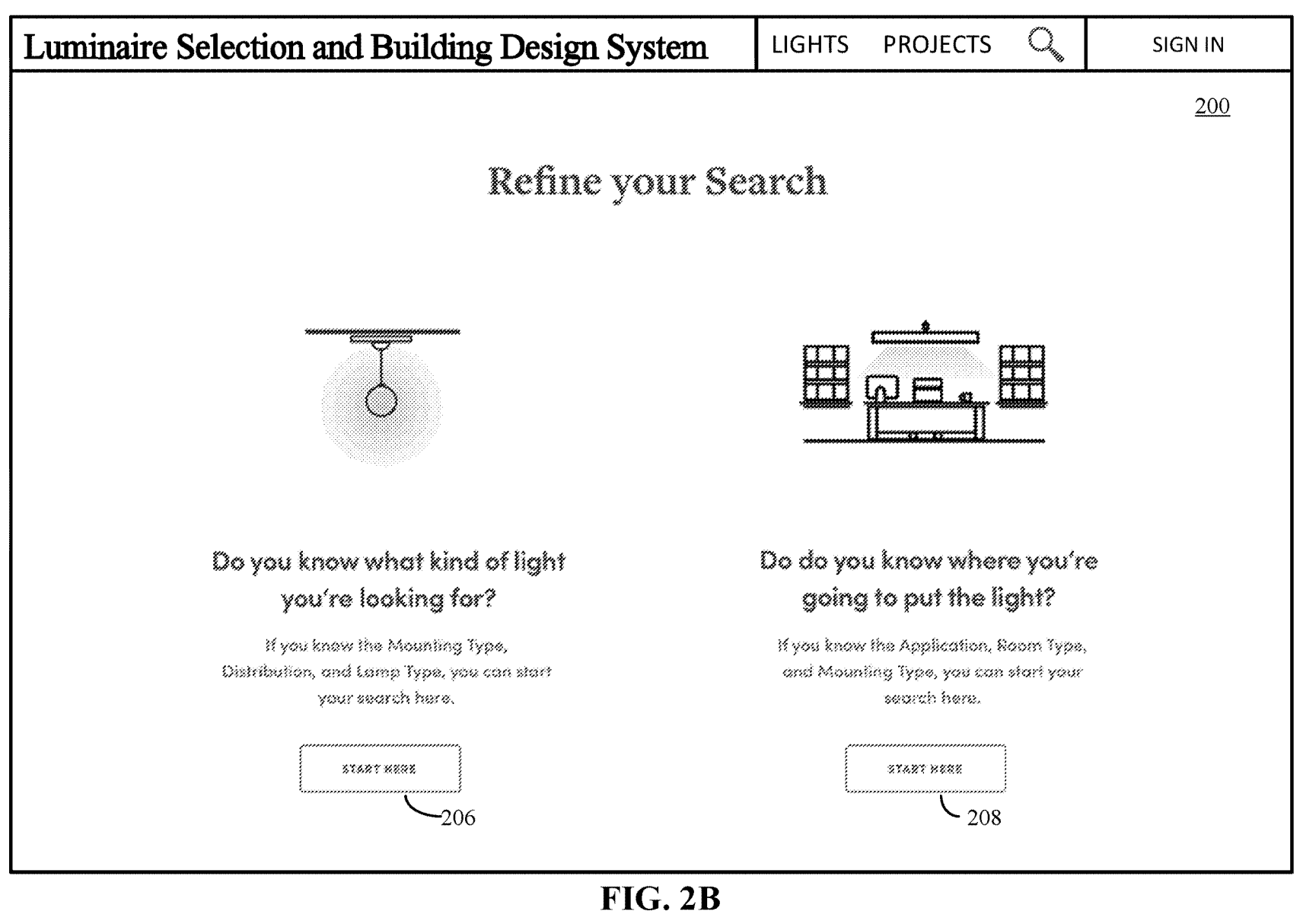

Referring to FIG. 2B, once the user selects whether they would like to search for indoor or outdoor luminaires, the user may be presented with options to further refine their search.

In the illustrative example, the user is provided with options to refine their search based on what kind of luminaire they are looking for (e.g., via a mounting flow command 206) or where they are going to put the luminaire (e.g., via an application flow command 208).

In the illustrative example, the user can refine their search based on what kind of luminaire they are looking for via the mounting flow command 206 if the user knows one or more of the mounting type, distribution, and lamp type of the luminaire they are searching for.

In the illustrative example, the user can refine their search based on where they are going to put the luminaire via the application flow command 208 if the user knows one or more of an application, room type, and mounting type of the luminaire they are searching for.

Within each option to refine a search, the user is presented with one or more selectable attributes to choose from. As previously discussed, the selectable attributes are tailored for each user type. Therefore, the selectable attributes available for one user type may be different than the selectable attributes available for another user type.

In the illustrative examples of FIGS. 2C-2I, the user has signed on as S. Smith (a contractor), as denoted in the user information field 209, and has selected the indoor command 202 as described in FIG. 2A and the mounting flow command 206 as described in FIG. 2B. In the illustrative example, since the user has selected to refine the search based on what kind of luminaire they are looking for via the mounting flow command 206, the user is walked through a mounting flow in order to select attributes such as a mounting type, a source type, and a distribution type. This example flow is shown in FIGS. 2C-2I.

Figure 2C:
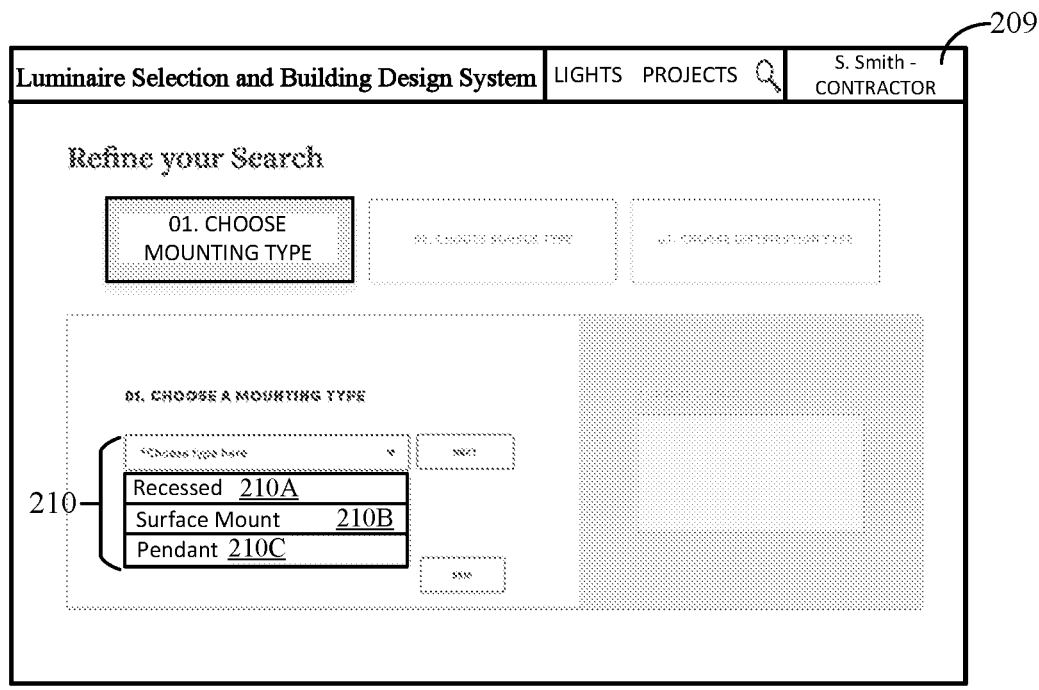

Referring to FIG. 2C, the user is presented with a drop-down menu of selectable mounting type attributes 210. In this case, the selectable attributes include a recessed attribute 210A, a surface mount attribute 210B, and a pendant attribute 210C. It should be noted that other attributes may be provided for selection by the user.

Figure 2D:
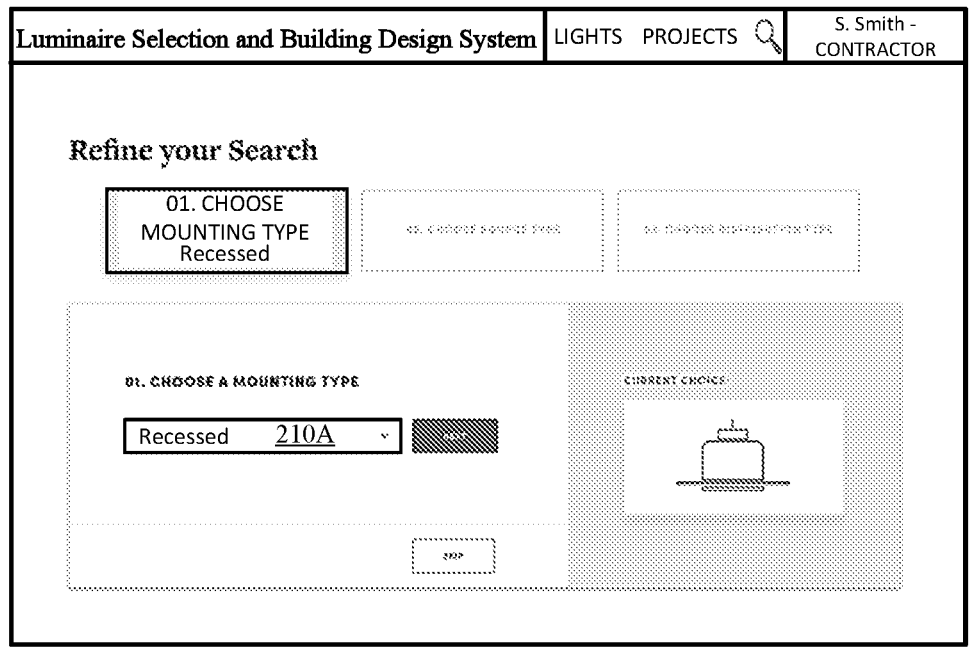

As shown in FIG. 2D, the user selected the recessed attribute 210A provided in the drop-down box of selectable mounting type attributes 210 as described in FIG. 2C.

Figure 2E:
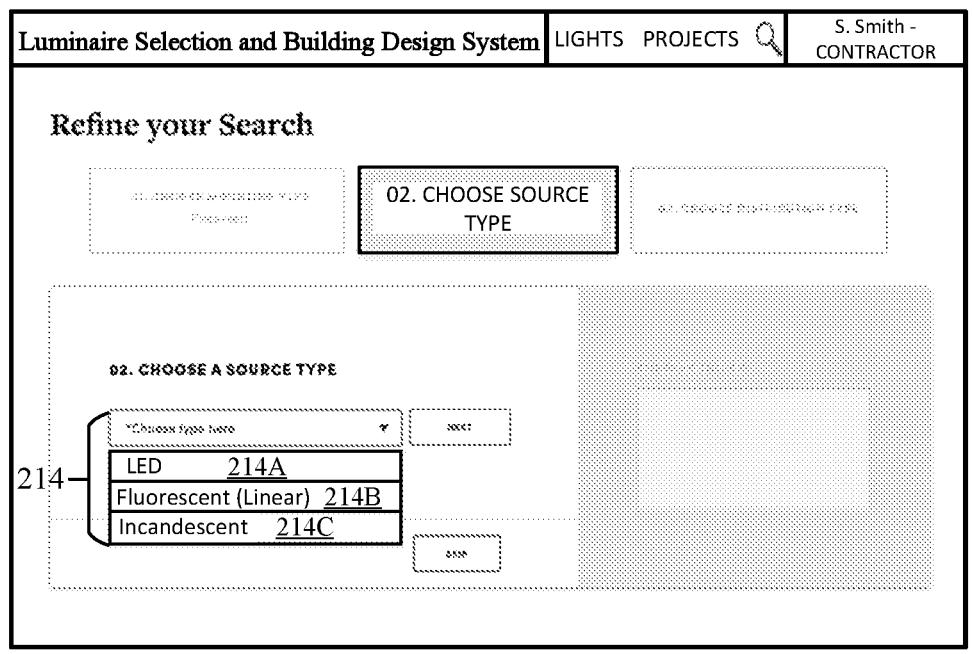

Referring to FIG. 2E, the user is asked to choose an attribute related to a source type. The user can select a source type attribute from a drop-down box of selectable source type attributes 214. In this case, the selectable source type attributes include an LED attribute 214A, a fluorescent (linear) attribute 214B, and an incandescent attribute 214C. It should be noted that other attributes may be provided for selection by the user.

Figure 2F:
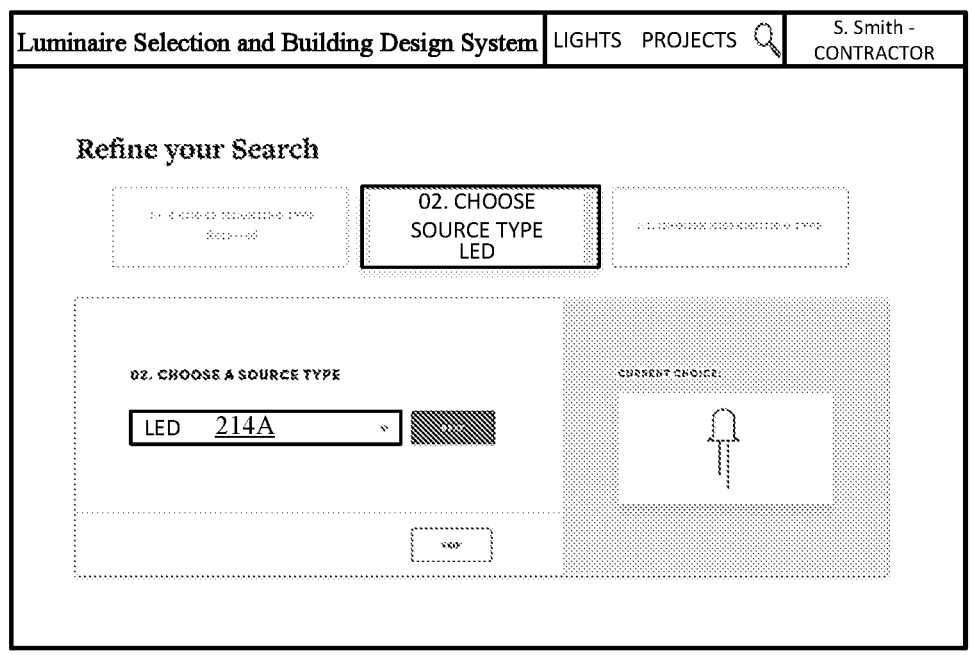

As shown in FIG. 2F, the user selected the LED attribute 214A provided in the drop-down box of selectable mounting type attributes 214 as described in FIG. 2E.

Figure 2G:
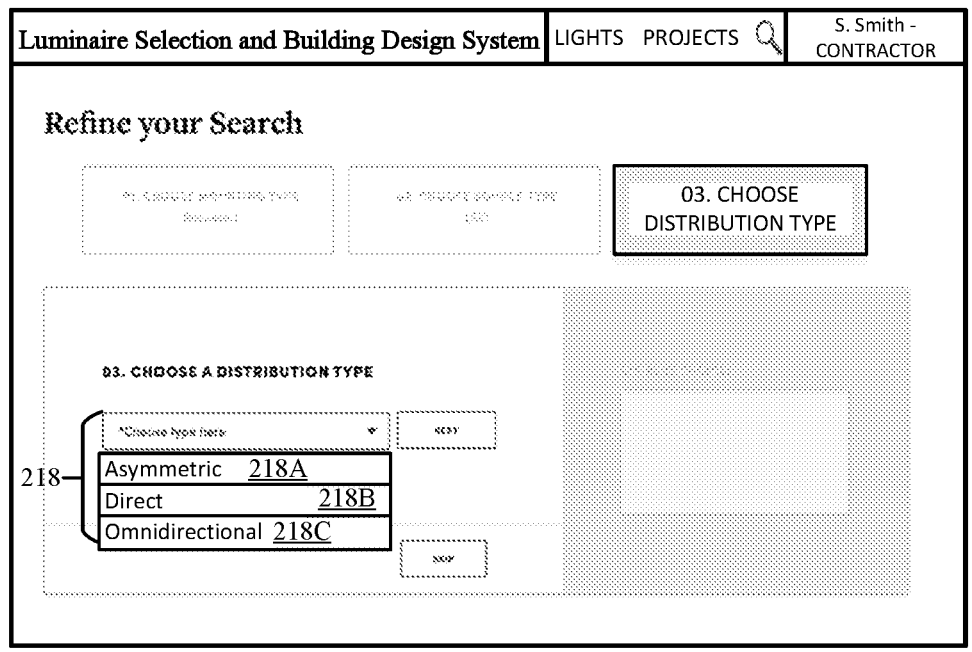

Referring to FIG. 2G, the user is asked to choose an attribute related to a distribution type. The user can select a distribution type attribute from a drop-down box of selectable distribution type attributes 218. In this case, the selectable distribution type attributes include an asymmetric attribute 218A, a direct attribute 218B, and an omnidirectional attribute 218C. It should be noted that other attributes may be provided for selection by the user.

Figure 2H:
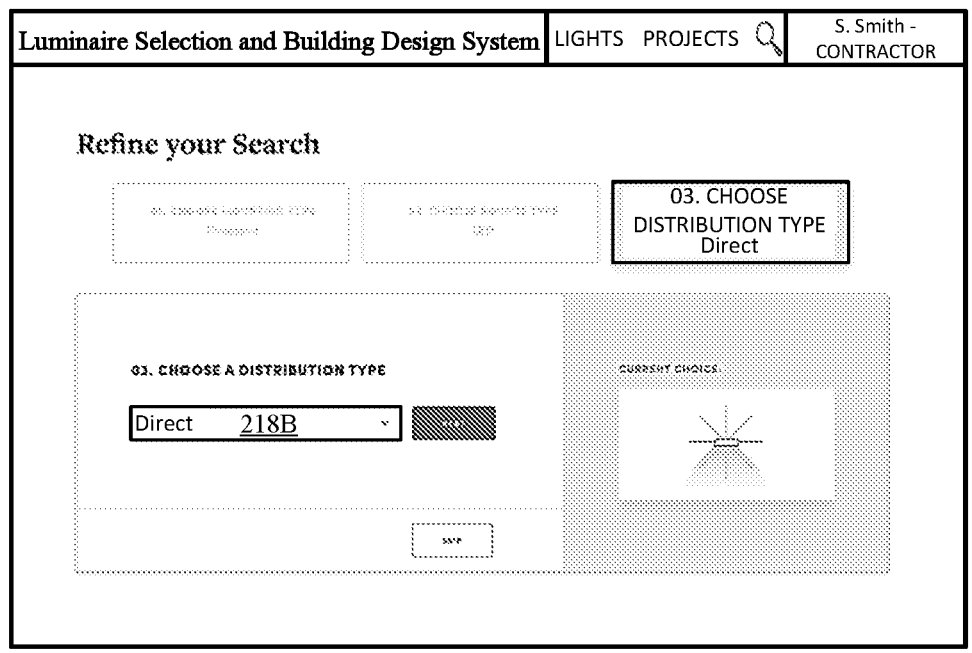

As shown in FIG. 2H, the user selected the direct attribute 218B provided in the drop-down box of selectable distribution type attributes 218 as described in FIG. 2G.

Figure 2I:
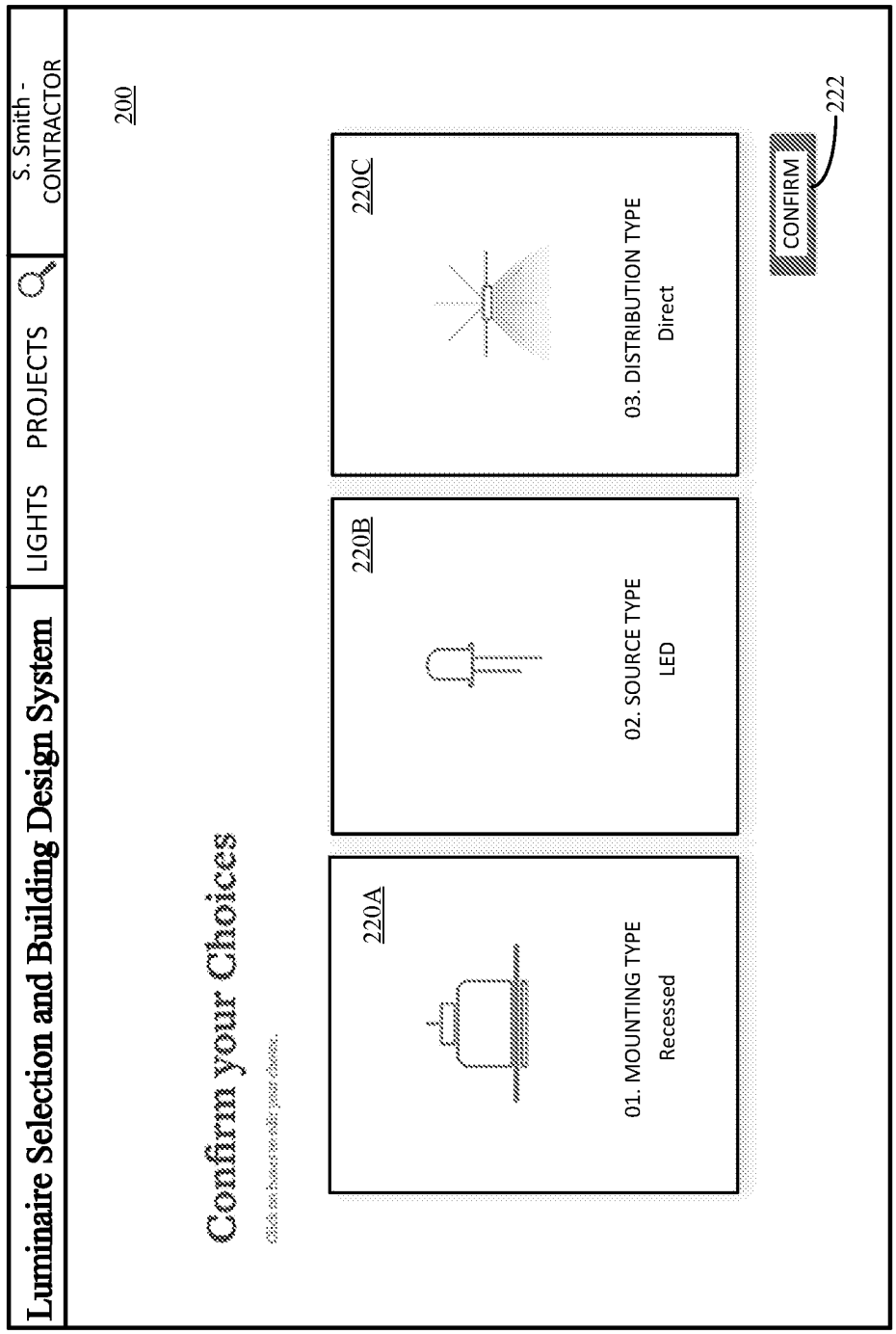

Referring to FIG. 2I, the user's selected attributes are displayed with visual indicators, in this case, selectable boxes 220 (e.g., mounting type box 220A, a source type box 220B, and a distribution type box 220C). At this point, users can either edit their choices by selecting one of the boxes 220 or confirm their choices by selecting a confirm command 222.

In the illustrative example, the recessed attribute (e.g., the recessed attribute 210A, as described with respect to FIG. 2C) is displayed with in mounting type box 220A; the LED attribute (e.g., the LED attribute 214A, as described with respect to FIG. 2E) is displayed within the source type box 220B; and the direct attribute (e.g., the direct attribute 218B, as described with respect to FIG. 2G) is displayed in the distribution type box 220C.

Figure 2J:
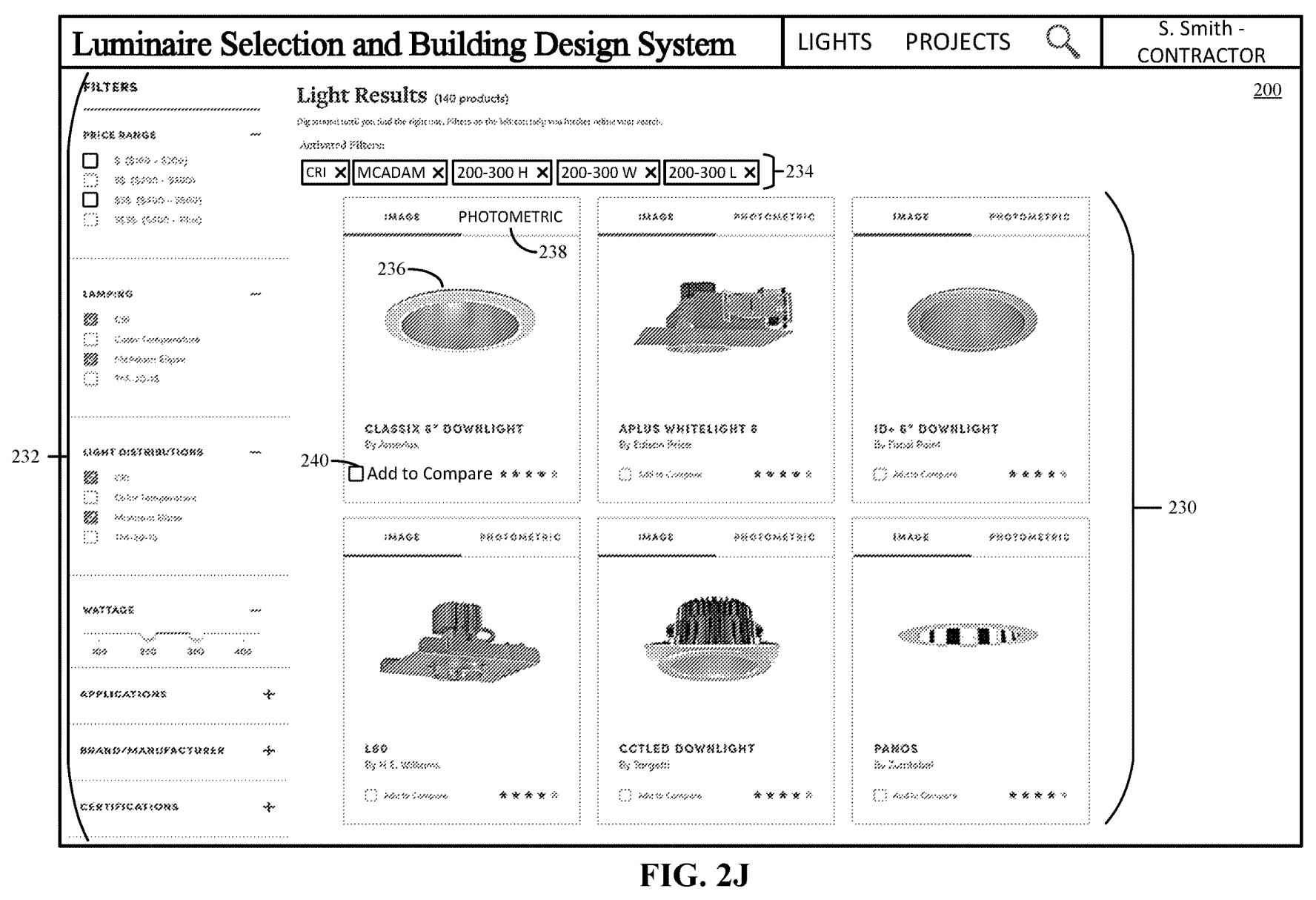

Referring to FIG. 2J, after selecting the confirm command 222 of FIG. 2I, the user is presented with luminaire results 230 within the GUI 200. In the illustrative example, each luminaire result of the luminaire results 230 is shown with an image of the associated luminaire, such as image 236. The user may select a photometric tab, such as photometric tab 238, in order to display an associated photometric distribution within each luminaire result of the luminaire results 230.

In some cases, the luminaire results 230 are selectable, where a selection of a result causes the GUI 200 to display a detailed view of the associated luminaire. The user may compare two or more luminaires by selecting an add to compare command, such as add to compare command 240, which is shown as an option for each luminaire result 230.

Filters 232 may be presented to further help refine the luminaire search. In the illustrative example, the filters 232 provided for the contractor user type include a price range, clamping, light distributions, wattage, applications, brand/manufacturer, and certifications. It should be understood that more or fewer filters may be provided for the contractor user type.

In this case, activated filters 234 include the CRI attribute and the McAdam Elipse attribute, which are both under the tamping and light distributions filters. The activated filters 234 further include the wattage between 200 and 300 W, the height between 200 and 300, the length between 200 and 300, and the width between 200 and 300.

Figure 2K:
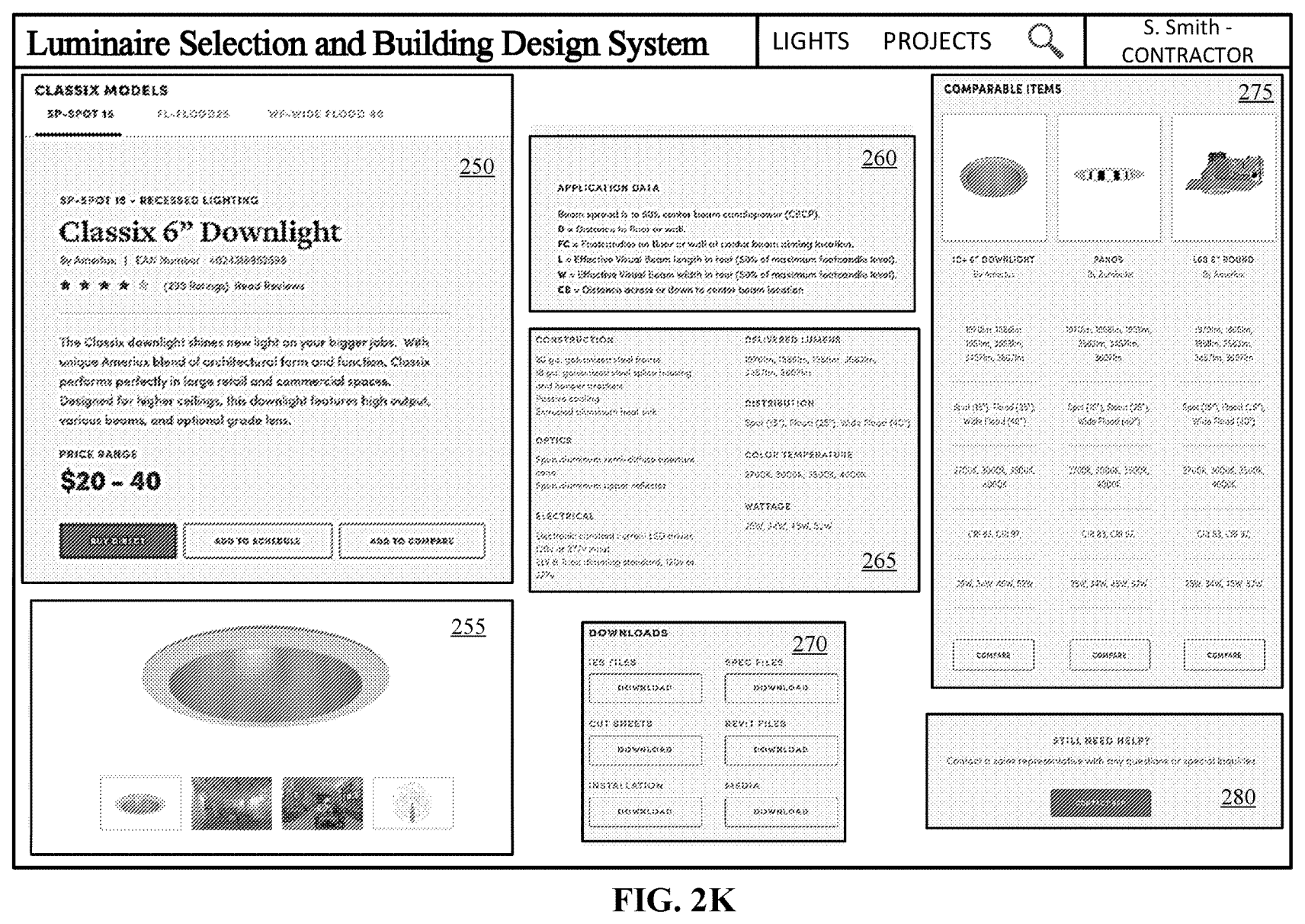

FIG. 2K illustrates an example detailed view after the user selected the Classix 6" Downlight luminaire from the luminaire results 230, as described with respect to FIG. 2J. In some scenarios, a contractor may use the luminaire platform to help create accurate estimates and bids. The detailed view can allow the user to easily understand the quality, details, and installation information of a product and quickly find similar luminaires.

In the illustrative example, a set of attributes is provided to the user. For example, in box 250, attributes such as name, manufacturer, description, and price range are provided. Additionally, box 250 includes commands, such as a buy direct command, an add to schedule command, and an add to compare command. The buy direct command provides direct purchase options, allowing for a direct purchase of a luminaire via the luminaire platform.

Box 255 includes an image of the luminaire, as well as a photometric distribution of the luminaire. Box 260 includes application data associated with the luminaire. Box 265 includes attributes such as construction information, optics, electrical information, delivered lumens, distribution, color temperature, and wattage. Box 270 includes available downloadable information for the luminaire, such as IES files, spec files, cut sheets, Revit and/or 3D files, installation information, and media information. Box 275 includes information comparing three luminaires to the selected Classix 6" Downlight luminaire. Box 280 includes contact information for lighting representative associated with the selected luminaire. In some cases, additional contact information can be provided, such as distributor contact information.

It should be understood that more or fewer attributes may be provided to the user in the detailed view of the luminaire. In addition, layout and groupings may vary according to page design choices.

Figure 3A:
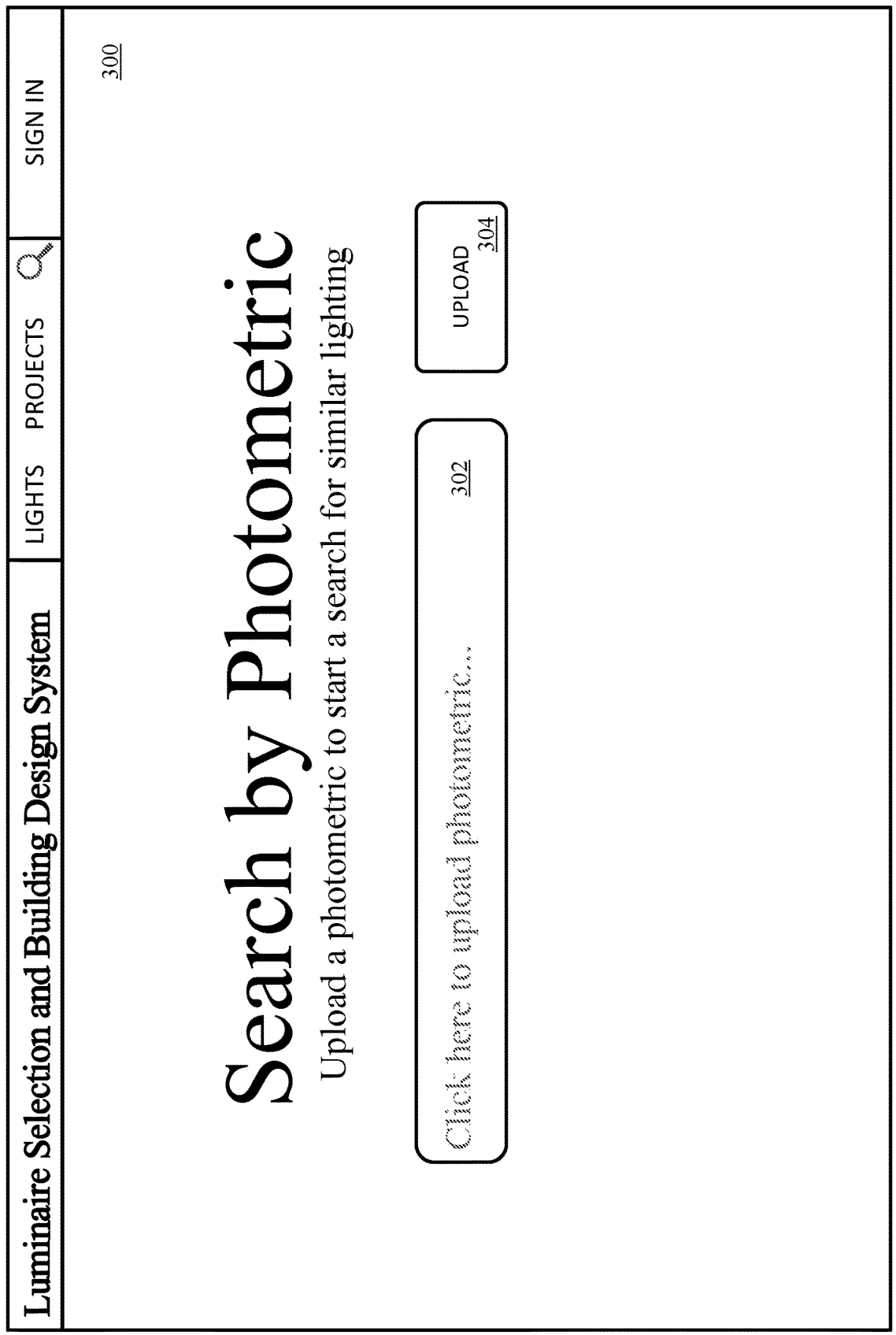

Referring to FIG. 3A, in another example scenario for beginning a search, a user may view a graphical user interface (GUI) 300 of the luminaire platform on their computing device and begin a luminaire search. In the illustrative example, the user is presented with a file upload field 302 and an upload command 304 within the GUI 300. The user can upload a photometric file associated with a luminaire in order to conduct a search for one or more luminaires satisfying matching criteria with respect to the photometric file.

In an example, a designer, such as an interior designer, can use the luminaire platform to help parse through millions of luminaires to meet design needs. The designer can upload a photometric file of a luminaire the designer frequently uses in order to find similar luminaires during the design process.

Figure 3B:
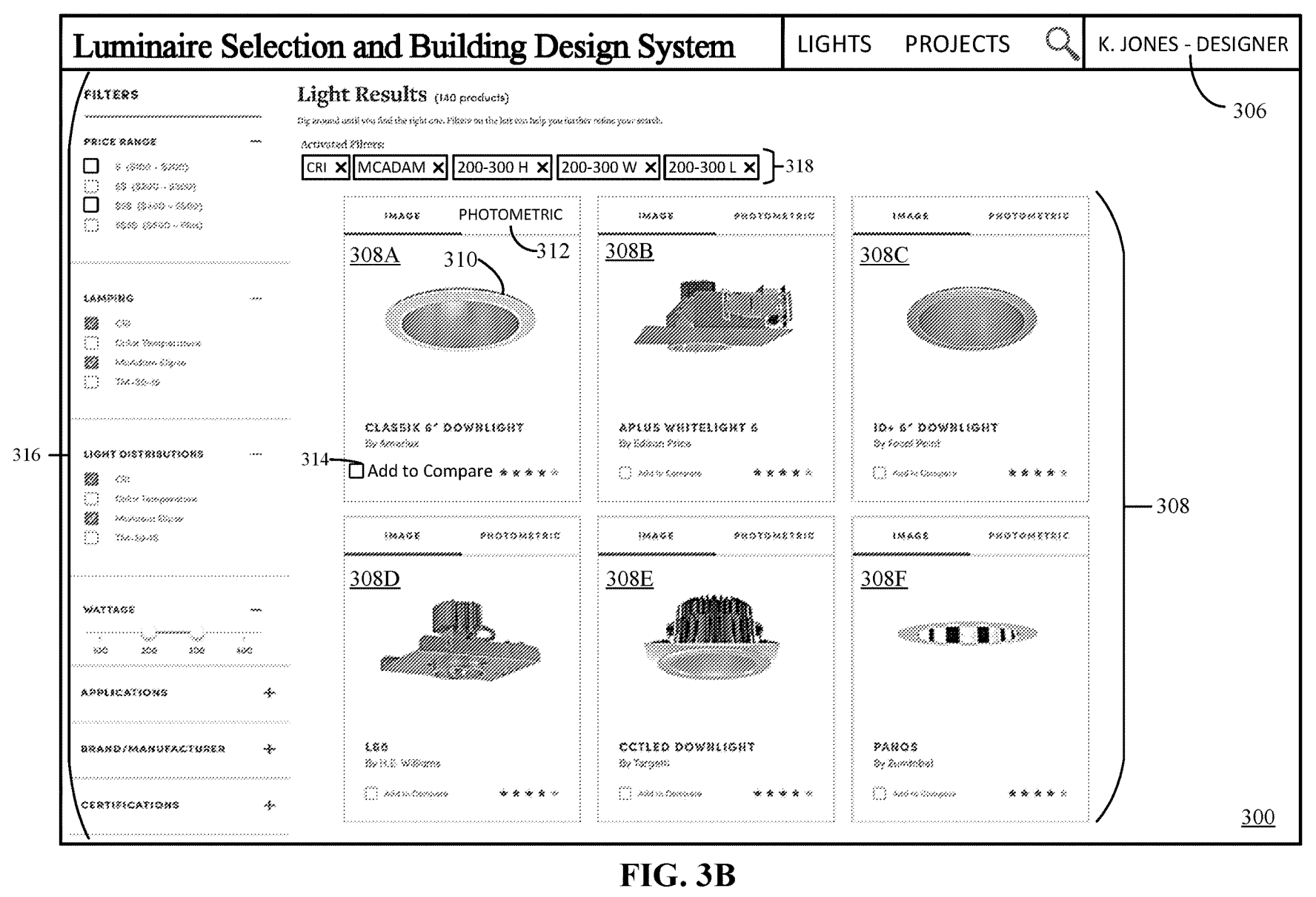

Referring to FIG. 3B, the user has signed on as K. Jones (a designer), as denoted in the user information field 306, and has uploaded photometric data in a photometric file of a luminaire, such as described in FIG. 3A. In the illustrative example, the user is presented with luminaire results 308 that match the photometric data in the uploaded photometric file, such as luminaire 308A, luminaire 308B, luminaire 308C, luminaire 308D, the luminaire 308E, and luminaire 308F.

In the illustrative example of FIG. 3B, each luminaire result of the luminaire results 308 is shown with an image of the associated luminaire, such as image 310. The user may select a photometric tab, such as photometric tab 312, in order to display an associated photometric distribution within each luminaire result of the luminaire results 308.

In some cases, selection of a result of the luminaire results 308 causes the GUI 300 to display a detailed view of the associated luminaire. The user may compare two or more luminaires by selecting an add to compare command, such as add to compare command 314, within each luminaire result 308.

Filters 316 may be presented to further help refine the luminaire search. In the illustrative example, the filters 316 provided for the designer user type include a price range, lamping, light distributions, wattage, applications, brand/manufacturer, and certifications. It should be understood that more or fewer filters may be provided for the designer user type.

In this case, activated filters 318 include the CRI attribute and the McAdam Elipse attribute, which are both under the lamping and light distributions filters. The activated filters 318 further include the wattage between 200 and 300 W, the height between 200 and 300, the length between 200 and 300, and the width between 200 and 300.

Figure 3C:
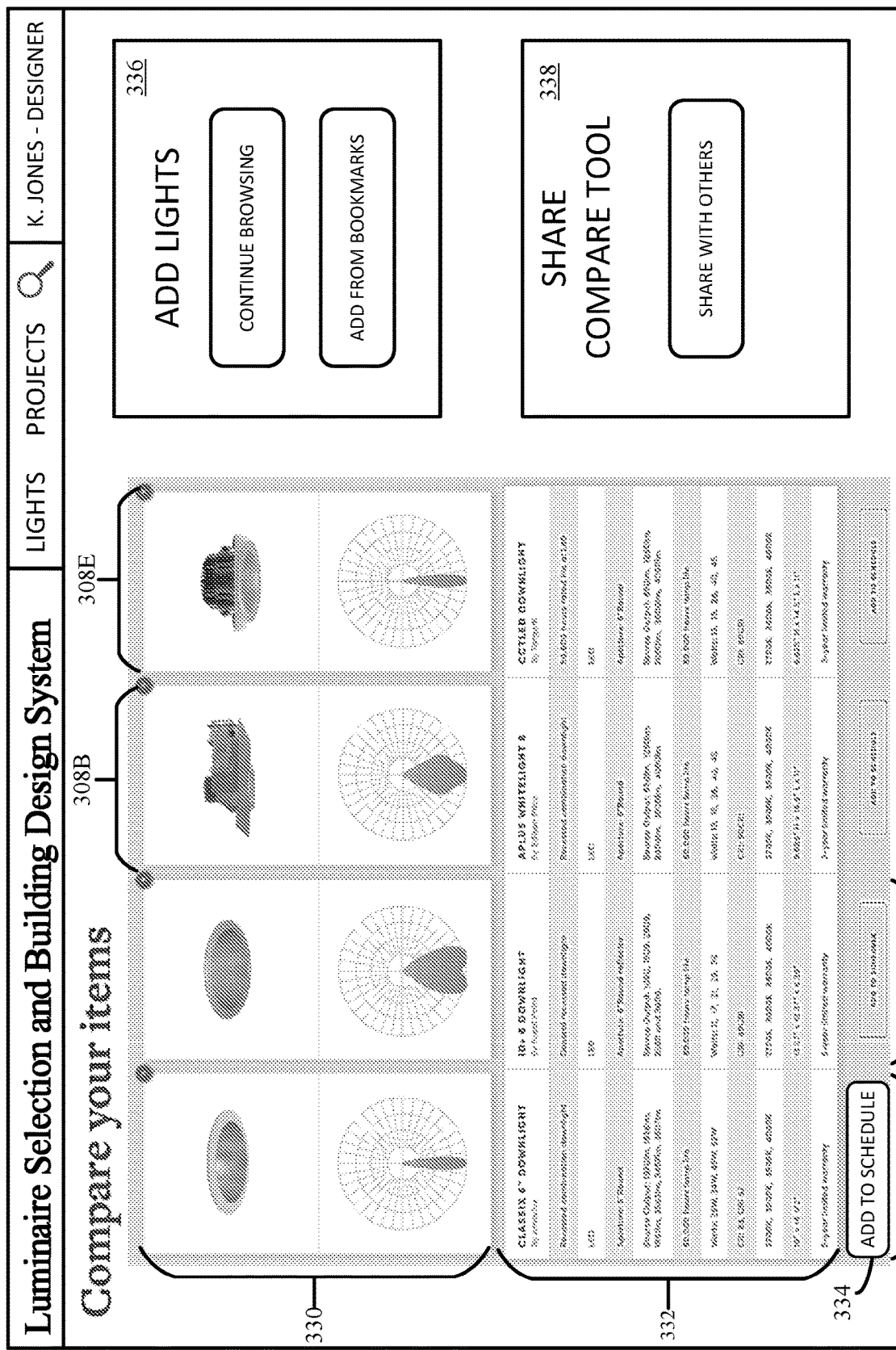

Referring to FIG. 3C, the user has selected four of the luminaire results 308 described with respect to FIG. 3B for comparison. The selected luminaires include luminaire 308A, luminaire 308B, luminaire 308C, and luminaire 308E, as described with respect to FIG. 3B. When providing two or more luminaires for comparison, the luminaire platform can display attributes associated with each of the luminaires selected for comparison.

In the illustrative example, an image and photometric section, such as image and photometric section 330, can display both the image and the photometric distribution for each luminaire; and a detailed section, such as detail section 332, can display various attributes such as name, manufacturer, watts, and CRI.

An "add to schedule" command, such as "add to schedule" command 334, may be provided for each of the luminaires being compared. The add to schedule command allows the user to add one or more selected luminaires to a luminaire schedule. A luminaire schedule can be created by a designer and can include information that is required during the design phase of the building project, such as mounting option information, physical parameters, and light radiation parameters.

The user can add additional luminaires to be compared via the add lights section 336. In some cases, the user can perform an additional search in order to add the additional luminaires. In some cases, the user can add additional lights from the bookmarks page.

The user can share the compared luminaires and associated attributes with other users via a share compare tool 338. For example, a designer of a building project may want to share the selected luminaires with the architect of the building project or the general contractor of the building project. In this case, once the designer selects the luminaires to be compared, the designer can share the compared luminaires by selecting the share compare tool 338.

For the illustrative examples of FIGS. 3D-3G, the user has selected to add luminaire 308B and luminaire 308C to a luminaire schedule. In some cases, the user can create a new luminaire schedule in which to add luminaire 308B and luminaire 308C. In some cases, luminaire 308B and luminaire 308C can be added to an existing schedule.

In the illustrative examples of FIGS. 3D-3G, the user is walked through a luminaire schedule flow in order to either create a new luminaire schedule or add the luminaires to an existing luminaire schedule.

Figure 3D:

Referring to FIG. 3D, the first step in the luminaire schedule flow is to determine a quantity of luminaires in which to add to a luminaire schedule. In the illustrative example, the user is presented with the option to adjust the quantity of each luminaire being added to a luminaire schedule via a quantity field, such as quantity field 340.

In the illustrative example, the price range (e.g., price range 342) for each luminaire is displayed. When the user enters a quantity and the quantity field for a luminaire, the luminaire platform displays a total amount 344 that adding these luminaires to the schedule will cost.

Once the user has selected the quantity for each luminaire to be added to a schedule, the user can either select to add the luminaires to an existing schedule via an existing schedule command 346 or create a new schedule in which to add the luminaires via new schedule command 348.

In the illustrative example, the user can select additional luminaires to be added to the luminaire schedule via the add more lights section 350. In some cases, the user can perform an additional search in order to add the additional luminaires. In some cases, the user can add additional lights from the bookmarks page.

Figure 3E:
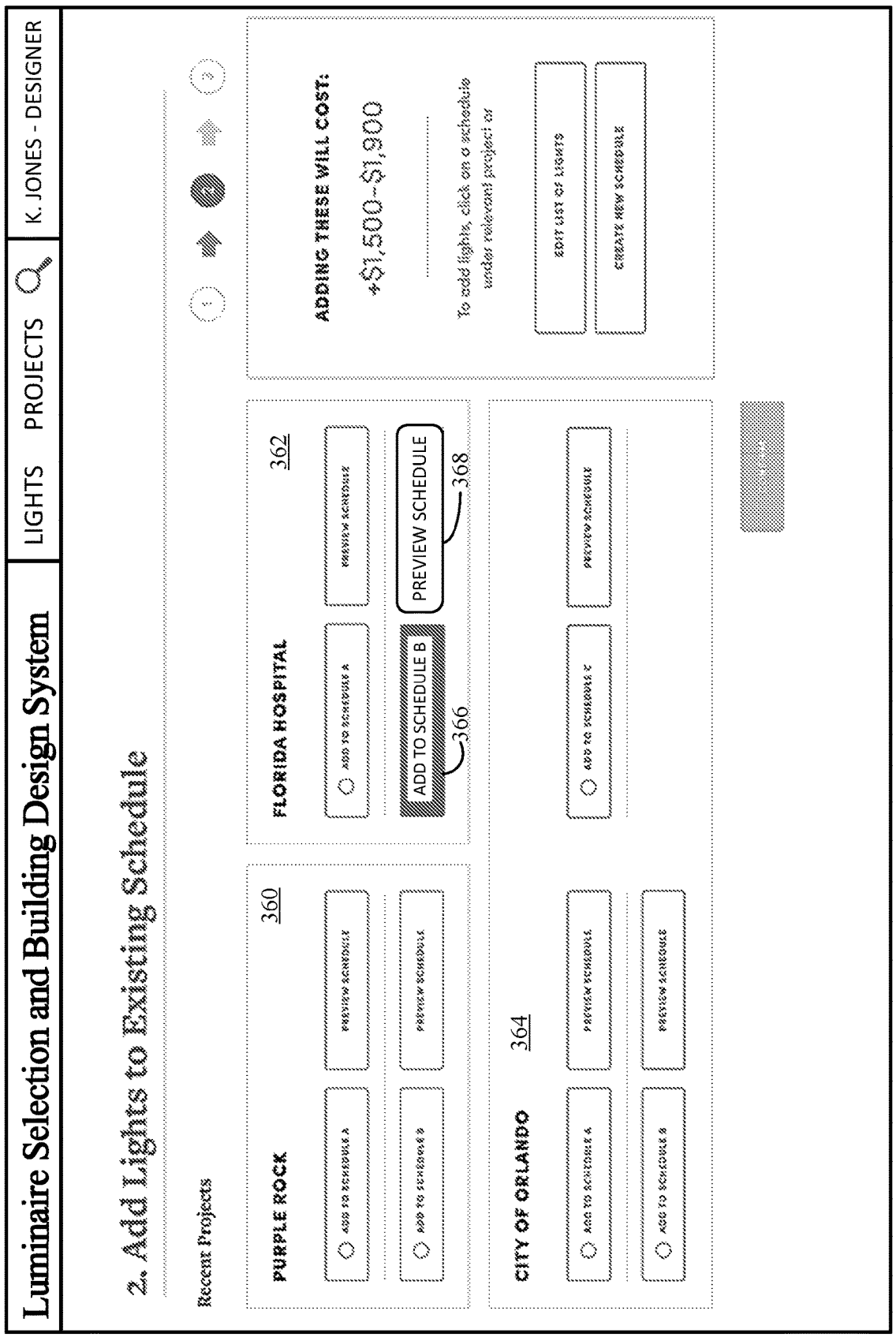

Referring to FIG. 3E, the user has selected to add luminaires to an existing schedule via the existing schedule command 346 as described with respect to FIG. 3D. In the illustrative example, recent projects, such as a Purple Rock project 360, a Florida Hospital project 362, and a City of Orlando project 364 are provided for selection.

In the illustrative example, each recent project includes multiple schedules, such as schedule B 368, in which to add the luminaires. The user can select a preview schedule command, such as preview schedule command 366 for the Florida Hospital project 362, in order to view the schedule before selecting to add the luminaires to that schedule.

Referring to FIG. 3F, the user has selected to add the luminaires to schedule B 366 of the Florida Hospital project 362, as described with respect to FIG. 3E. In the illustrative example, schedule B 366 includes two schedule options in which to add the luminaires (e.g., schedule B 366 or schedule B2 368). Within each schedule option, multiple groups, such as emergency room group 370, are available to add the luminaires.

It should be understood that the projects, the schedules, and the groups for each user can be user defined and modified at any time.

Figure 3G:
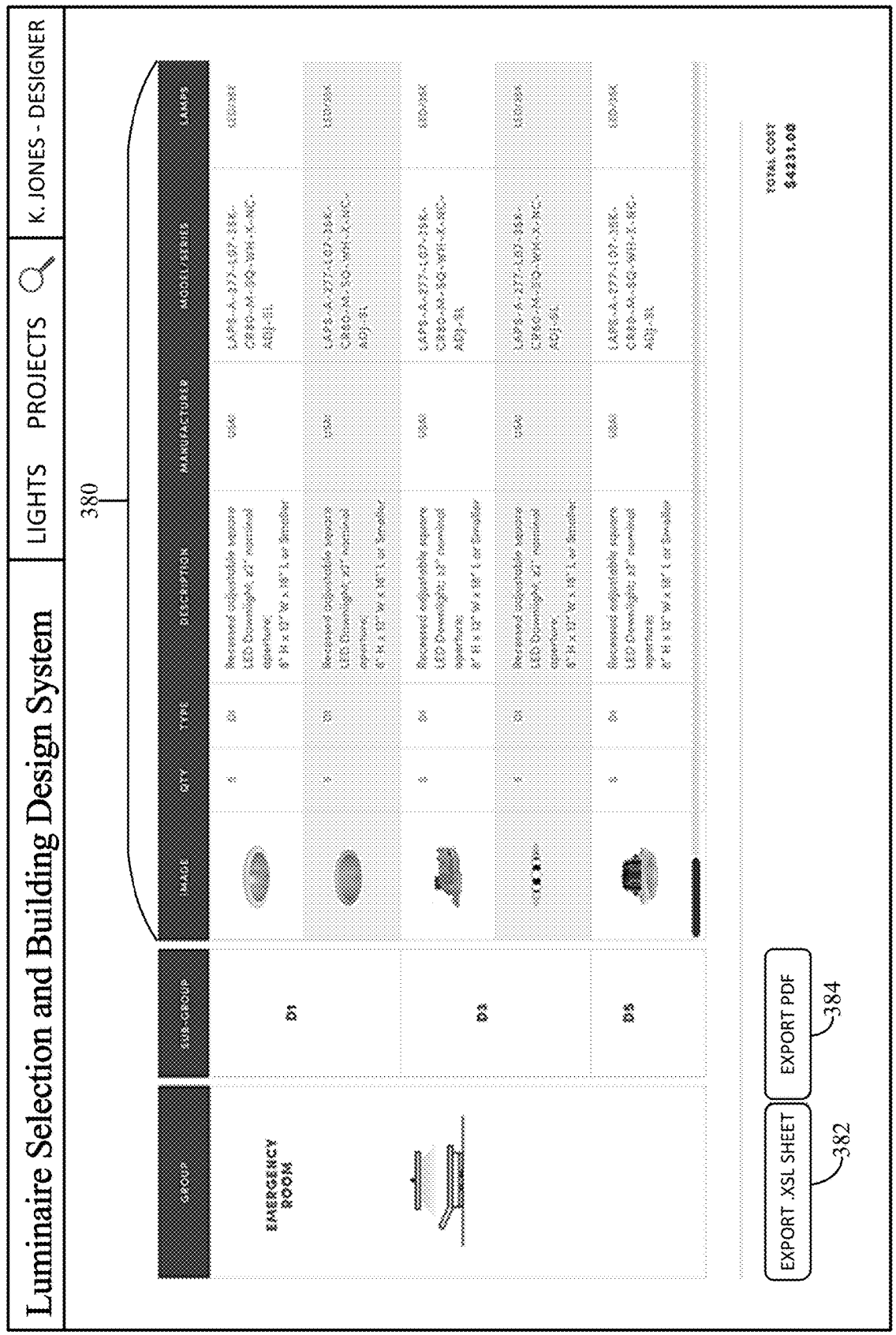

Referring to FIG. 3G, the user has selected to add the luminaires to the emergency room group 370 of schedule B 366. In the illustrative example, luminaire attributes 380 for each luminaire automatically populated with the emergency room group 370 of schedule B 366.

Advantageously, the user can choose a luminaire from the luminaire results provided by the luminaire platform and the attributes for that luminaire can be auto populated in the luminaire schedule. Additionally, the luminaire platform can provide additional luminaire options that satisfy the requirements for that type of luminaire. For example, the user may select one luminaire to add to the luminaire schedule and the luminaire platform can automatically add one or more additional luminaires to the luminaire schedule that meet the same criteria as the selected luminaire.

The luminaire schedule can be exported in a variety of ways. For example, the user can export the luminaire schedule to a .xsl sheet via an export sheet command 382 or a PDF via an export PDF command 384.

Figure 4:
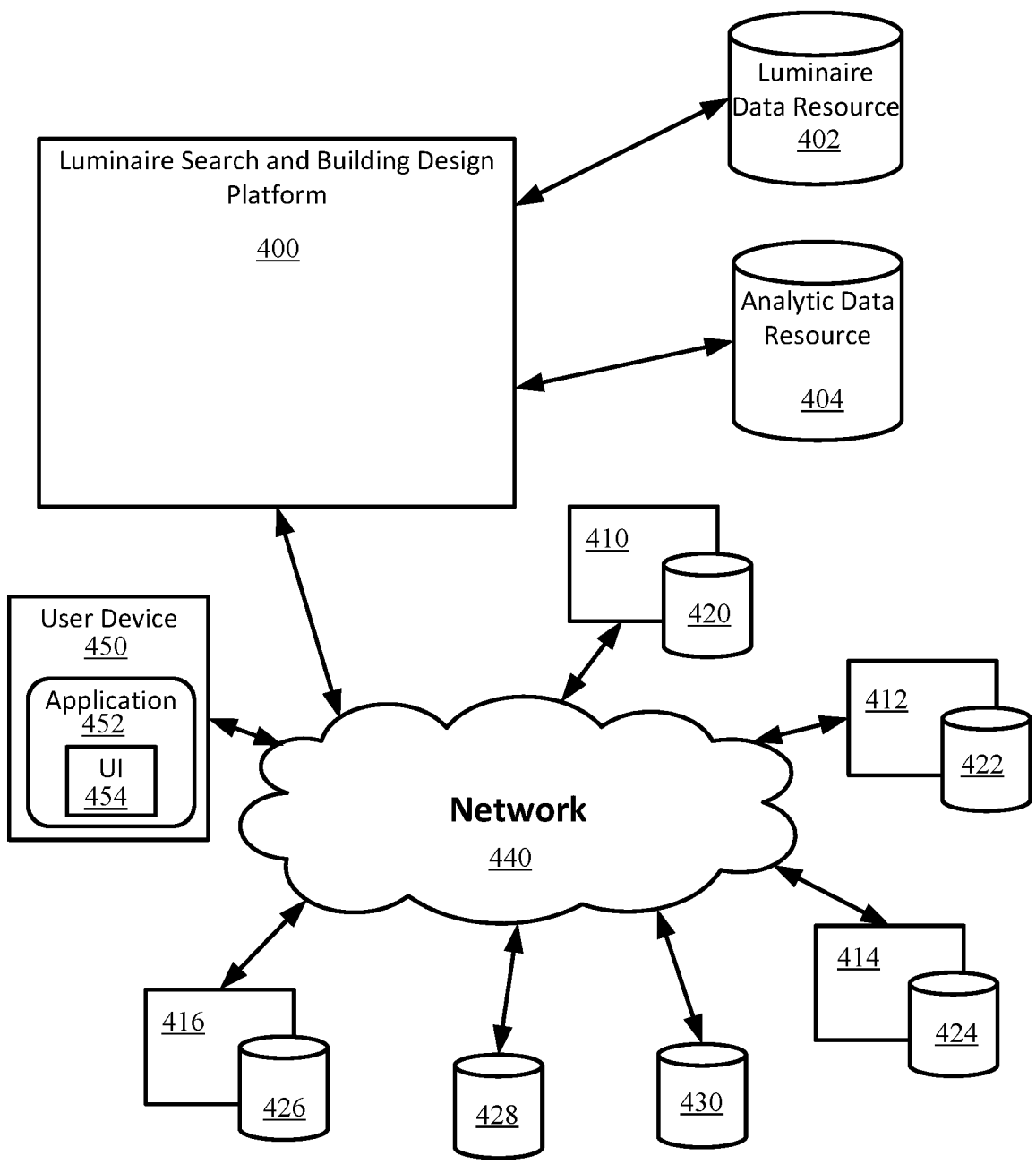
FIG. 4 illustrates an example operating environment in which various embodiments of the invention may be practiced.
Figure 5:
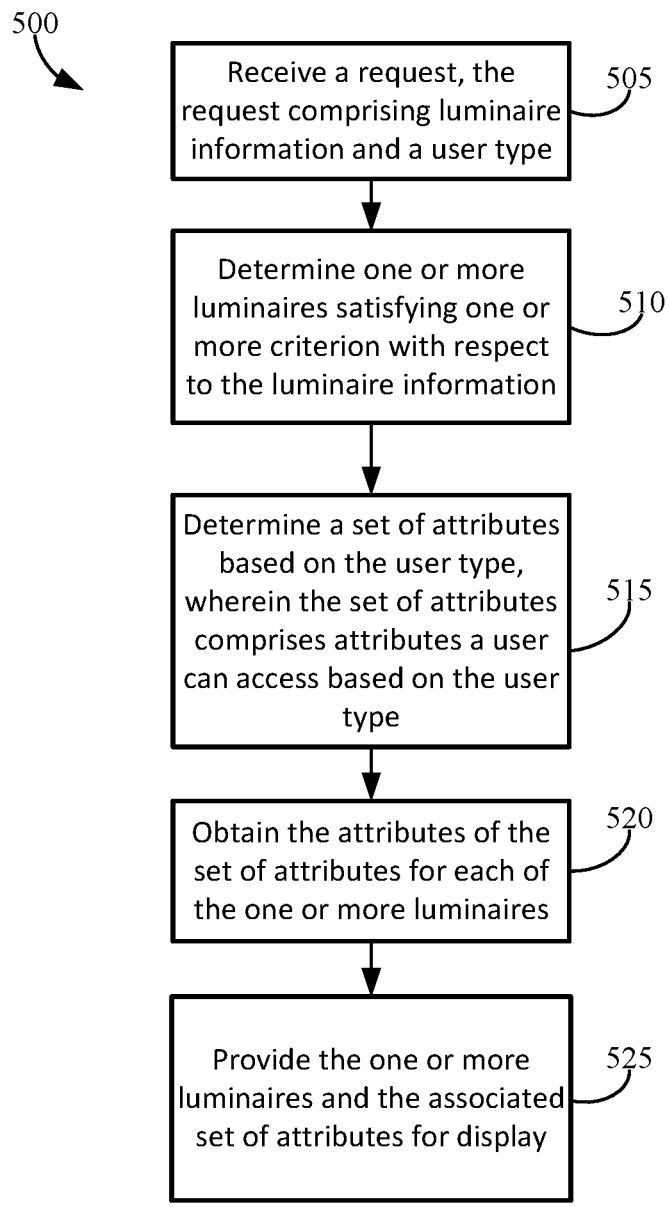
FIG. 5 illustrates an example process flow diagram for supporting luminaire search and architectural design according to an embodiment of the invention.

FIG. 4 illustrates an example operating environment in which various embodiments of the invention may be practiced; and FIG. 5 illustrates an example process flow diagram for supporting luminaire search and architectural design according to an embodiment of the invention.

Figure 6:
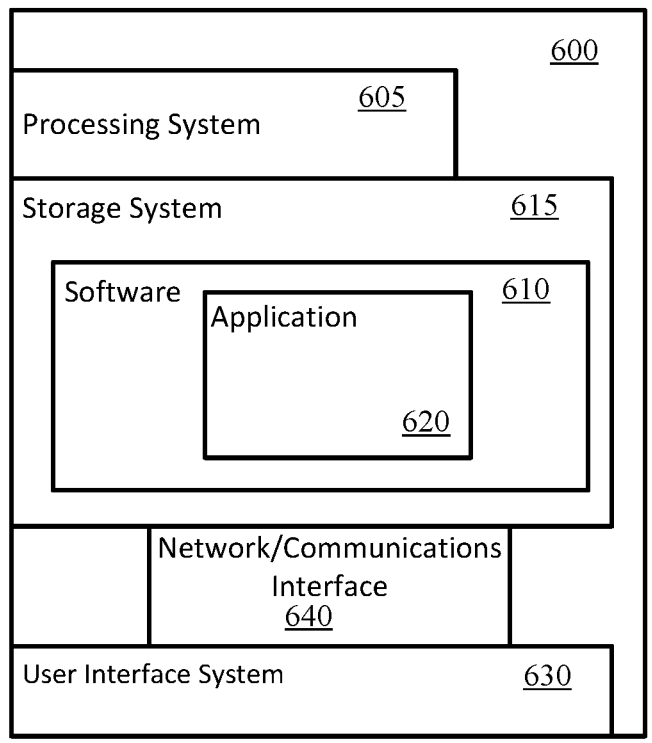
FIG. 6 illustrates components of a computing device that may be used in certain embodiments described herein.
Figure 7:
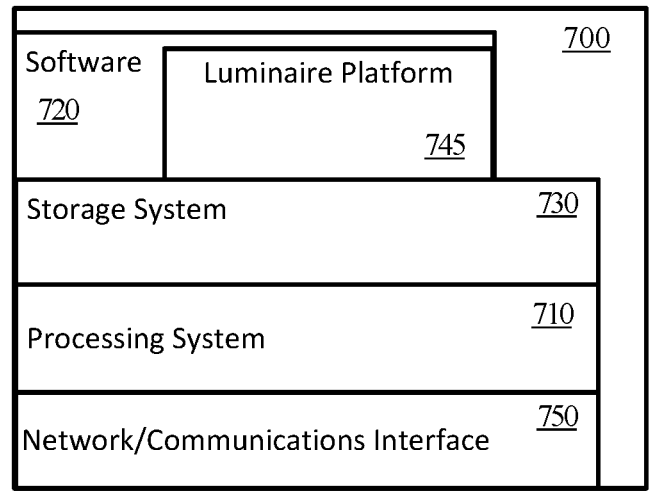
FIG. 7 illustrates components of a computing system that may be used to implement certain methods and services described herein.

Referring to FIG. 4, the example operating environment may include a luminaire platform 400 performing processes, such as process 500 as described with respect to FIG. 5, which can be embodied such as described with respect to system 600 of FIG. 6 or system 700 of FIG. 7. The luminaire platform 400 includes or communicates with one or more structured data resources, such as luminaire data resource 402 and analytic data resource 404, each of which may store data sets. It should be understood that these structured data resources may be the same or different structured data resources.

The luminaire platform 400 can communicate with one or more services (e.g., service 410, service 412, service 414, and service 416) and/or data resources (e.g., data resource 420, data resource 422, data resource 424, data resource 426, data resource 428, and data resource 430) over a network 440. The one or more services and/or data resources may include, for example, services performing photometric calculations or conversions and luminaire manufacturer data resources.

The example operating environment may also include user device 450 running an application 452 with an application user interface (UI) 454. The user device can be any computing device such as, but not limited to, a laptop computer, a desktop computer, a tablet, a personal digital assistant, a smart phone, a smart television, a gaming console, a wearable device, and the like.

The example operating environment allows users to access the luminaire platform 400 via the application 452 or other applications running on the user device 450. Additionally, a user may access the luminaire platform 400 when using a productivity application (e.g., a spreadsheet application) with a luminaire plug-in or browser extension running on the user device 450. The browser extension may be available separate from a productivity application, and instead be an extension of web-browsing software like GOOGLE CHROME or MICROSOFT EDGE, or as a website where this functionality can be accessed.

The luminaire data resource 402 may store dynamically generated data, including information related to a variety of luminaires. The luminaire data resource 402 can include a schema providing a specified structure for attributes of the luminaire. The schema can include a list of attributes associated with a luminaire and can identify how to store the attributes related to that luminaire. The list of attributes can then be used to obtain information to fill out the schema.

These attributes may not be available from a single resource, but the luminaire platform 400 can either obtain and store the attributes in the luminaire data resource 402 or maintain an index to locations where the information is stored. In some cases, the luminaire platform 400 can either directly or indirectly (e.g., via API) perform photometric calculations to obtain the attributes for the luminaire data resource 402.

The information related to a variety of luminaires may include, but is not limited to, attributes such as a product ID, manufacturer name, product classification, housing material, lens material, lamp type, lamp color, lamp color rendering index (CRI), Lamp R values, correlated color temperature (CCT), TM-30 metrics (e.g., color fidelity index (Rf), gamut index (Rg), and color vector graphic), color quality scale (CQS), photometric distribution, product operating voltage, product wattage consumed, photometric files as IES files, photometric web image, image or product, performance and distribution type of lumens, lumen output, contact for purchase such as distributor, seller, representative, product cost variables, catalog number of product per parameter of construction, cutsheet or specification of product, BIM models optimized for 2D and/or 3D software, cost per unit, cost per square foot, cost per the life of the product, and cost per operating hour, or combinations thereof.

The analytic data resource 404 may include information from a community of users. This analytic information can include frequency data related to luminaires (e.g., a number of times a certain luminaire is viewed, compared, added to a schedule, etc.). The analytic information may be used to determine popularity and/or relevancy of a luminaire, manufacturer, user type, etc. In an example, the analytic information can include when, during the construction phase, a luminaire is added to or deleted from a luminaire schedule, as well as user feedback as to why the luminaire was added or deleted from the luminaire schedule.

The analytic information can include certain user information, when granted permission by the user, obtained from context information or directly from user input. For example, user identification may not be stored with analytic information, but characteristics such as user location, user type, and more can be stored as part of the analytic information and may be used to group and categorize information. For example, popularity of a particular luminaire may be identified from frequency data related to adding luminaires to a schedule for users in a particular geographical location or of a particular user type.

The analytic data resource 404 can record popularity of a luminaire across multiple dimensions, for example, global popularity, popularity for a user type, popularity for a room type in a building, and popularity of a given user.

Analytic information may include subsets of the entire community. For example, communities can be public or closed for certain architectural projects. Some communities can be permanent groupings and others may be project-specific (and even dissolve after a project or a period of time).

It should be understood that any data stored regarding specific users would be done in a matter following established norms and rules for privacy (and involve user approval).

Components (computing systems, storage resources, and the like) in the operating environment may operate on or in communication with each other over the network 440. The network 440 can be, but is not limited to, a cellular network (e.g., wireless phone), a point-to-point dial up connection, a satellite network, the Internet, a local area network (LAN), a wide area network (WAN), a WiFi network, an ad hoc network or a combination thereof. Such networks are widely used to connect various types of network elements, such as hubs, bridges, routers, switches, servers, and gateways. The network 440 may include one or more connected networks (e.g., a multi-network environment) including public networks, such as the Internet, and/or private networks such as a secure enterprise private network. Access to the network 440 may be provided via one or more wired or wireless access networks as will be understood by those skilled in the art.

Communication to and from the components may be carried out, in some cases, via application programming interfaces (APIs). An API is an interface implemented by a program code component or hardware component (hereinafter "API-implementing component") that allows a different program code component or hardware component (hereinafter "API-calling component") to access and use one or more functions, methods, procedures, data structures, classes, and/or other services provided by the API-implementing component. An API can define one or more parameters that are passed between the API-calling component and the API-implementing component. The API is generally a set of programming instructions and standards for enabling two or more applications to communicate with each other and is commonly implemented over the Internet as a set of Hypertext Transfer Protocol (HTTP) request messages and a specified format or structure for response messages according to a REST (Representational state transfer) or SOAP (Simple Object Access Protocol) architecture.

Referring to both FIG. 4 and FIG. 5, the luminaire platform 400 can receive a request (505). The request can comprise luminaire information and a user type. In some cases, the request may be for one or more luminaires that satisfy one or more criteria and with respect to the luminaire information.

As previously described, a user type can include, but is not limited to, architects, interior designers, lighting designers, landscape architects, engineers, design/builders, general contractors, electrical contractors, electrical distributors, lighting representative agencies, building owners and lighting manufacturers.

The luminaire information may be received through a variety of channels and in a number of ways. In some cases, the luminaire information can include an image of a luminaire. For example, a user may access the luminaire platform 400 and upload an image of a luminaire through an interface. An example of this is shown in FIG. 1A. The image of the luminaire can be an image of both the interior and exterior portions of a luminaire. The image of the luminaire can be an application image or an installed image. An application image may be an image of an entire room, including a luminaire. An installed image may be a close-up image of an installed luminaire, such as an image of the exterior portions of the luminaire.

In the case where the luminaire information includes an image of the luminaire, parameters may be extracted from the image for the luminaire information. The parameters may be extracted from metadata provided as part of the luminaire information and/or identified from image recognition techniques, such as image analysis or optical character recognition (OCR). For image recognition/image analysis, some aspects may be performed by the luminaire platform 400 and/or via an API to an image analysis service, such as available through engines like Microsoft Bing or Google.

In some cases, the luminaire platform 400 leverages a photo matching engine that can help identify luminaires that likely match the luminaire in the image. The identification of the luminaire may further include feedback from a user if multiple possible matches are found.

In some cases, the luminaire information can include one or more selected attributes. An example of this is shown in FIGS. 2A-2I. As previously described, the selectable parameters are tailored for each user type. The luminaire platform 400 provides each user type access to a certain set of attributes and the set of attributes available for one user type may be different than that of another user type. One or more attributes of the set of attributes may be presented to the user as selectable attributes. In some cases, a user may select one or more attributes through a pulldown menu.

In some cases, the luminaire information can include photometric data. For example, a user may access the luminaire platform 400 and upload a photometric file comprising the photometric data. The photometric file may be in various formats, such as an IES file or EULUMDAT file. An example of this is shown in FIG. 3A.

In some cases, the luminaire information can include spreadsheet information. The spreadsheet information can include one or more attributes of a set of attributes for a luminaire. For example, the user may access the luminaire platform 400 and upload a spreadsheet, such as a luminaire schedule. The spreadsheet information can be extracted from the spreadsheet for the luminaire information.

The luminaire platform 400 can determine (510) one or more luminaires satisfying one or more criterion with respect to the luminaire information. The luminaire platform 400 allows for one or more luminaires to be searched for and evaluated based on one or more search criteria.

In some cases, the luminaire platform 400 can query the luminaire data resource 402 for the one or more luminaires using the luminaire information. For example, the luminaire information may be used as the search criteria when querying the luminaire data resource 402.

In some cases, the search criteria can include a luminescent tolerance. The luminescent tolerance can be calculated based on the received luminaire information, such as the one or more selected attributes provided by a user or the photometric data provided within a photometric file or spreadsheet information.

In some cases, the one or more luminaires are determined based on satisfying matching criteria with respect to photometric performance. As an example, photometric file 2D polar candela graphs from one or more luminaires may be compared to the photometric file 2-D polar candela associated with the received luminaire information. The one or more luminaires can be identified based on similar performance.

In some cases, a user can designate an acceptable plus tolerance level and/or an acceptable minus tolerance level between the luminaire information and others. Then, any products that meet the one or more criterion on with respect to the luminaire information, in combination with the tolerance designated by the user, can be provided as acceptable luminaires.

The luminaire platform 400 can determine (515) a set of attributes based on the user type. The luminaire platform 400 provides each user type access to a certain set of attributes. The set of attributes comprises attributes a user can access based on the user type and the set of attributes for one user type may be different than that of another user type. The set of attributes can define which attributes need to be obtained for each luminaire and presented to the user based on the user type.

Examples of attributes include, but are not limited to, manufacturer name, product classification, housing material, lens material, lamp type, lamp color, rendering index (CRI), Lamp R values, correlated color temperature (CCT), TM-30 metrics (e.g., color fidelity index (Rf), gamut index (Rg), and color vector graphic), color quality scale (CQS), photometric distribution, product operating voltage, product wattage consumed, photometric files as IES files, photometric web image, image or product, performance and distribution type of lumens, lumen output, contact for purchase such as distributor, seller, representative, product cost variables, catalog number of product per parameter of construction, cutsheet or specification of product, BIM models optimized for 2D and/or 3D software, cost per unit, cost per square foot, cost per the life of the product, and cost per operating hour, or combinations thereof.

Attributes may be categorized in a variety of ways. One example of an attribute category may be key performance identifiers. Key performance identifiers may include, but is not limited to, CRI (color rendering index) and Fidelity index (Rf).

Another example of an attribute category may include mounting options. The mounting options are directly related to how a luminaire is mounted and can include different varieties that encapsulate the various locations (e.g., interior or exterior, ceiling, and wall) and types of installation and service interaction with the luminaire itself. Examples of mounting options include, but are not limited to, surface mount, recessed mount, flush mount, wall mount, arm mount, bracket mount, and hole mount.

Another example of an attribute category may include physical parameters. The physical parameters relate to the actual dimensions of the luminaire itself. The physical parameters can include, but are not limited to, exterior dimensions of the luminaire, types of exterior and interior materials used to make the luminaire. In some cases, the physical parameters can include the type of finish, the type of paint, the reflectance, and thickness of various portions of the luminaire.

Yet another example of an attribute category may include light radiation parameters. Light radiation parameters are directly related to the performance of the light-emitting portion of the luminaire. The light-emitting portion can be any suitable light-emitting source, such as, but not limited to, from a light emitting diode (LED), a fluorescent tube, and an incandescent. The light radiation parameters can include, but are not limited to, spectral distribution, color temperature of the light, R values (e.g., relating to color rendering of a person's skin), and CRI (e.g., relating to how accurate the light depicts the color of an actual object that it is lighting).

The luminaire platform 400 can obtain (520) the attributes of the set of attributes for each of the one or more luminaires.

As previously described, each luminaire can include a schema providing a specified structure for attributes of the luminaire. The schema can include a plurality of attributes associated with a luminaire and can identify how to store the attributes related to that luminaire. The plurality of attributes can then be used to get information to fill out the schema.

These attributes may not be available from a single resource, but the luminaire platform 400 can either obtain and store the attributes in the luminaire data resource 402 or maintain an index to locations where the information is stored. In some cases, the luminaire platform 400 can either directly or indirectly (e.g., via API) perform photometric calculations to obtain the information for the luminaire data resource 402.

In some cases, one or more attributes are retrieved from the luminaire data resource 402 storing previously obtained attributes. For example, a manufacturer may input attributes associated with a luminaire to the luminaire platform 400 and the attributes can be saved to the luminaire data resource 402. In this case, one or more attributes can be retrieved from the luminaire data resource 402.

In some cases, one or more attributes are retrieved from other services (e.g., service 410, service 412, service 414, and service 416) and/or data resources (e.g., data resource 420, data resource 422, data resource 424, data resource 426, data resource 428, and data resource 430).

In some cases, the attributes are obtained from one or more cards (or "models") received from a search engine service. The card can include data on the luminaire, such as attributes related to the luminaire.

In some cases, the attributes are retrieved using any suitable web scraping technique. For example, the web scraping techniques may be performed using web crawlers or other information extractors, which extract the attributes from luminaire product details in PDFs. In some cases, the web crawlers may use a web crawling strategy that first narrows down the possible web pages to those web pages related to luminaires. The websites used by the web crawler may include manufacturer websites or other luminaire industry websites.

In some cases, one or more attributes are obtained by calculating an attribute using other attributes. In one case, the luminaire platform 400 can calculate a desired attribute using other attributes such as attributes previously stored in the luminaire data resource 402 or retrieved from other services or data resources.

In another case, the luminaire platform 400 communicates with a separate service to calculate an attribute. In some cases, the luminaire platform 400 can communicate the other attributes to the separate service in order for the separate service to calculate the attribute. In some cases, the separate service can obtain the other attributes in order to calculate the attribute.

In some cases, key performance identifiers, such as CRI (color rendering index) and fidelity index (Rf), may be calculated/identified for a luminaire when a search is returned. For example, higher fidelity products in terms of quality of the light may be identified using a TM-30-15 calculator.

In some cases, the luminaire platform 400 normalizes terminology and the units of the attributes. The luminaire platform 400 can convert attributes in one unit into another unit. This can be done so all attributes are displayed in common, consistent units. The luminaire platform 400 can convert the attribute itself or communicate with a separate service to convert the attribute.

As an example, given a scenario where some or all of the attributes the set of attributes have been previously obtained, if one or more of the attributes are not in a desired unit, they can be converted into the desired unit. As another example, the attributes may be converted to a desired unit as they are obtained and before storage in the luminaire data resource 402.

In some cases, one of the attributes obtained may be a radiometric quantity and the remaining attributes may be in photometric quantities. In this case, the radiometric quantity may be converted to a photometric quantity before being provided for display with the other attributes already in photometric quantities.

As an example, an attribute for power may have been obtained and stored as radiant flux, which is measured in watts (W) and is a radiometric unit. If a user requests all attributes be displayed as photometric quantities, the attribute for power should be provided as luminous flux, whose SI unit is the lumen (lm) and is a photometric unit. In this case, watts may be converted to lumens.

As another example, if the attributes for a luminaire were obtained from an IES photometric data file and the user requests the attributes be displayed in an EULUMDAT photometric data file format, the attributes may be converted from the IES format to the EULUMDAT format.

Once the attributes are obtained by either retrieving them from additional data resources or calculating them using other attributes, the attributes can be stored in the luminaire data resource 402.

As an illustrative example, a luminaire determined to satisfy the one or more criterion with respect to luminaire information provided by a user includes a schema indicating ten attributes (e.g., attribute 1, attribute 2, attribute 3, attribute 4, attribute 5, attribute 6, attribute 7, attribute 8, attribute 9, and attribute 10) are to be associated with the luminaire. In the illustrative example, four attributes (attribute 1, attribute 2, attribute 4, and attribute 7) have been previously obtained and stored associated with the luminaire in the luminaire data resource 402.

Continuing the illustrative example, the luminaire platform 400 determines that the set of attributes includes five attributes (attribute 1, attribute 3, attribute 5, attribute 7, and attribute 9). These five attributes in the set of attributes are determined based on the user type of the user and include the attributes to be displayed to the user with the luminaire results.

Continuing the illustrative example, the luminaire platform 400 obtains each of the five attributes of the set of attributes. The attributes of the set of attributes can be obtained in a variety of ways.

In this case, since attribute 1 and attribute 7 of the set of attributes have been previously obtained and stored in the luminaire data resource 402, the luminaire platform 400 can retrieve attribute 1 and attribute 7 from the luminaire data resource 402.

The remaining attributes (attribute 3, attribute 5, and attribute 9) are obtained in other ways. The luminaire platform 400 can communicate with a separate service and/or data resource to retrieve attribute 3.

The luminaire platform 400 can calculate attribute 5 and attribute 9 using other attributes. For example, the luminaire platform 400 can calculate attribute 5 using attribute 1 and attribute 2, which were previously obtained and stored in the luminaire data resource 402.

The luminaire platform 400 can communicate with a separate service to calculate attribute 9 using attribute 1 and attribute 3. The luminaire platform 400 can communicate attribute 1 and attribute 3 to the separate service in order for the separate service to calculate attribute 9.

Unlike conventional searches, the luminaire platform 400 can normalize the format (e.g., units) and terminology for the attributes in the set of attributes before providing the set of attributes for display. In the illustrative example, attribute 7 is in radiometric units, while the remaining attributes of the set of attributes are in photometric units. The luminaire platform 400 converts attribute 7 to a photometric unit. Therefore, each attribute of the set of attributes are in consistent units.

Once the attributes are obtained, the attributes are stored associated with the luminaire in the luminaire data resource 402. In the illustrative example, seven attributes (attribute 1, attribute 2, attribute 3, attribute 4, attribute 5, attribute 7, and attribute 9) of the schema's ten attributes are now stored associated with the luminaire in the luminaire data resource 402.

The luminaire platform 400 can provide (525) the one or more luminaires and the associated set of attributes for display. In some cases, the one or more luminaires and associated set of attributes are provided for display in a viewer of a user interface, such as application UI 454. For example, two or more luminaires may be provided for a comparison display. In some cases, some attributes of the set of attributes may be displayed with the one or more luminaires, such as shown in FIG. 1B, FIG. 2J, and FIG. 3B.

The user can select one or more of the displayed luminaires to view additional attributes of the set of attributes, such as shown in FIG. 2K. For example, a user may select a command, such as a view detail command, for a luminaire. In response to the selection of the command, the luminaire platform 400 can provide additional attributes of the set of attributes to be displayed. In some cases, every attribute of the set of attributes is displayed.

In some cases, users can select two or more luminaires to be displayed for comparison, such as shown in FIG. 3C. In an example, the two or more luminaires may be selected to perform a detailed comparison of the photometrics (.ies files) that show a 2D overlap of web and 3D rotatable visualization. The selected product IDs may be received by the luminaire platform 400 for comparison. The luminaire platform 400 can retrieve data associated with the luminaires, 2D web and 3D photometric distributions and provide photometric data to display a visualization of photometric distributions.

In some cases where the luminaire information is spreadsheet information, the luminaire platform 400 can automatically fill a spreadsheet having the spreadsheet information with any missing attributes of the associated set of attributes. For example, a user may upload a luminaire schedule as the luminaire information. The luminaire schedule may only have a portion of the attributes filled in for each desired luminaire. In this case, the luminaire platform 400 can determine luminaires satisfying matching criteria with respect to the luminaire information and automatically populate the missing attributes for those luminaires.

In another example, a user may upload a luminaire schedule as the luminaire information. The user may then select one or more attributes from the attributes the user can access based on the user's user type. The luminaire platform 400 can determine one or more luminaires satisfying matching criteria with respect to the one or more selected attributes and auto populate the luminaire schedule with the attributes associated with each of the one or more determined luminaires.

In some cases, an option may be provided to create additional forms and/or update additional forms using the attributes associated with the one or more luminaires. The additional forms may be any suitable form used in the industrial lighting and architectural industry, such as a luminaire specification. As an example, a configurator may be accessed to build a luminaire specification. The configurator may be part of or separate from the luminaire platform 400.

In some cases, a designer can select one luminaire and the luminaire platform 400 can help provide additional luminaires that best match the luminaire selected by the designer. For example, one or more luminaires may be presented to the user. The user may select one of those luminaires and the luminaire platform 400 can determine additional luminaires that match that selected luminaire.

In some cases, the luminaire platform 400 may obtain one or more user preferences. The user preferences may include, but are not limited to, one or more of price preferences, energy efficiency preferences, popularity preferences, location preferences, and regulatory preferences, such as current regulatory requirements and information. In some cases, user preferences may be a default user preference, such as most popular.

As previously described, the analytic data resource 404 can record popularity of a luminaire across multiple dimensions, for example, global popularity, popularity for a user type, popularity for a room type in a building, and popularity of a given user. It should be understood that any data stored regarding specific users would be done in a manner following established norms and rules for privacy (and involve user approval).

The luminaire platform 400 may rank the one or more luminaires based on the obtained one or more user preferences. The ranked one or more luminaires may then be provided for display, along with the associated set of attributes.

As an illustrative example, a contractor may be searching for the most energy efficient luminaires that meet the regulations of the state of Florida. In this case, the luminaire platform 400 can determine which luminaires meet the regulations of the state of Florida and then rank those luminaires based on energy efficiency.

As another example, a building owner may be searching for the most cost effective and energy efficient luminaires. In this case, the luminaire platform 400 can rank the one or more luminaires based on cost and energy efficiency.

In some cases, the user may switch between which user preferences, such as energy efficient, cost efficiency (e.g., budget friendly), or lighting representative. The luminaire platform 400 can modify the ranking of the one or more luminaires provided for display as results. In an example where the user selects product A as the preferred product, but wants to look at more cost effective options that still meet the "equal" parameter within an allowed tolerance, the luminaire platform 400 can keep product A displayed and modify the ranking of the remaining results.

In some cases, the luminaire platform 400 may sort the one or more luminaires based on the obtained one or more user preferences. In an example where a user indicates the luminaire is being used in a sensitive area, such as a clean room or a food processing area, the luminaire platform 400 can sort the one or more luminaires based on regulatory preferences, such as Ingress Protection (IP) ratings or Underwriters Laboratories (UL) listings.

In some cases, the luminaire platform 400 can learn user preferences over time. The luminaire platform 400 may use any suitable machine learning process to learn the user preferences over time. In some cases, the luminaire platform 400 can make recommendations of product types. The recommendations may be based on, for example, user history in combination with project type. In some cases, the recommendations may not be limited to a specific project, but instead can be related to other use type parameters.

In some cases, the one or more luminaires and associated set of attributes provided is a holographic representation. For example, a user, while viewing a space, can holographically augment their designs by using for example an HMD device implementing a holographic enabled device. In their field of view, a user can view one or more luminaires received by the luminaire platform and transformed into holographic representations by the HMD device. The holographic representations can be anchored to the objects in the physical space. Attributes associated with the luminaire, such as price, can be shown along with the luminaire.

FIG. 6 illustrates components of a computing device that may be used in certain embodiments described herein; and FIG. 7 illustrates components of a computing system that may be used to implement certain methods and services described herein.

Referring to FIG. 6, system 600 may represent a computing device such as, but not limited to, a personal computer, a reader, a mobile device, a personal digital assistant, a wearable computer, a smart phone, a tablet, a laptop computer (notebook or netbook), a gaming device or console, an entertainment device, a hybrid computer, a desktop computer, or a smart television. Accordingly, more or fewer elements described with respect to system 600 may be incorporated to implement a particular computing device.

System 600 includes a processing system 605 of one or more processors to transform or manipulate data according to the instructions of software 610 stored on a storage system 615. Examples of processors of the processing system 605 include general purpose central processing units, application specific processors, and logic devices, as well as any other type of processing device, combinations, or variations thereof. The processing system 605 may be, or is included in, a system-on-chip (SoC) along with one or more other components such as network connectivity components, sensors, video display components.

The software 610 can include an operating system (not shown) and application programs such as application 620 that calls the luminaire platform as described herein. Device operating systems generally control and coordinate the functions of the various components in the computing device, providing an easier way for applications to connect with lower level interfaces like the networking interface.

Storage system 615 may comprise any computer readable storage media readable by the processing system 605 and capable of storing software 610 including the application 620.

Storage system 615 may include volatile and nonvolatile memories, removable and non-removable media implemented in any method or technology for storage of information, such as computer readable instructions, data structures, program modules, or other data. Examples of storage media of storage system 615 include random access memory, read only memory, magnetic disks, optical disks, CDs, DVDs, flash memory, magnetic cassettes, magnetic tape, magnetic disk storage or other magnetic storage devices, or any other suitable storage media. In no case is the storage medium a transitory propagated signal.

Storage system 615 may be implemented as a single storage device but may also be implemented across multiple storage devices or sub-systems co-located or distributed relative to each other. Storage system 615 may include additional elements, such as a controller, capable of communicating with processing system 605.

Software 610 may be implemented in program instructions and among other functions may, when executed by system 600 in general or processing system 605 in particular, direct system 600 or the one or more processors of processing system 605 to operate as described herein.

The system can further include user interface system 630, which may include input/output (I/O) devices and components that enable communication between a user and the system 600. User interface system 630 can include input devices such as a mouse, track pad, keyboard, a touch device for receiving a touch gesture from a user, a motion input device for detecting non-touch gestures and other motions by a user, a microphone for detecting speech, and other types of input devices and their associated processing elements capable of receiving user input.

The user interface system 630 may also include output devices such as display screen(s), speakers, haptic devices for tactile feedback, and other types of output devices. In certain cases, the input and output devices may be combined in a single device, such as a touchscreen, or touch-sensitive, display which both depicts images and receives touch gesture input from the user. A touchscreen (which may be associated with or form part of the display) is an input device configured to detect the presence and location of a touch. The touchscreen may be a resistive touchscreen, a capacitive touchscreen, a surface acoustic wave touchscreen, an infrared touchscreen, an optical imaging touchscreen, a dispersive signal touchscreen, an acoustic pulse recognition touchscreen, or may utilize any other touchscreen technology. In some embodiments, the touchscreen is incorporated on top of a display as a transparent layer to enable a user to use one or more touches to interact with objects or other information presented on the display.

Visual output may be depicted on the display (not shown) in myriad ways, presenting graphical user interface elements, text, images, video, notifications, virtual buttons, virtual keyboards, or any other type of information capable of being depicted in visual form.

The user interface system 630 may also include user interface software and associated software (e.g., for graphics chips and input devices) executed by the OS in support of the various user input and output devices. The associated software assists the OS in communicating user interface hardware events to application programs using defined mechanisms. The user interface system 630 including user interface software may support a graphical user interface, a natural user interface, or any other type of user interface. For example, the user interfaces for the application 620 described herein may be presented through user interface system 630.

Network interface 640 may include communications connections and devices that allow for communication with other computing systems over one or more communication networks (not shown). Examples of connections and devices that together allow for inter-system communication may include network interface cards, antennas, power amplifiers, RF circuitry, transceivers, and other communication circuitry. The connections and devices may communicate over communication media (such as metal, glass, air, or any other suitable communication media) to exchange communications with other computing systems or networks of systems. Transmissions to and from the communications interface are controlled by the OS, which informs applications of communications events when necessary.

Certain aspects described herein, such as those carried out by the luminaire platform described herein may be performed on a system such as shown in FIG. 7. Referring to FIG. 7, system 700 may be implemented within a single computing device or distributed across multiple computing devices or sub-systems that cooperate in executing program instructions. The system 700 can include one or more blade server devices, standalone server devices, personal computers, routers, hubs, switches, bridges, firewall devices, intrusion detection devices, mainframe computers, network-attached storage devices, and other types of computing devices. The system hardware can be configured according to any suitable computer architectures such as a Symmetric Multi-Processing (SMP) architecture or a Non-Uniform Memory Access (NUMA) architecture.

The system 700 can include a processing system 710, which may include one or more processors and/or other circuitry that retrieves and executes software 720 from storage system 730. Processing system 710 may be implemented within a single processing device but may also be distributed across multiple processing devices or sub-systems that cooperate in executing program instructions.

Storage system(s) 730 can include any computer readable storage media readable by processing system 710 and capable of storing software 720. Storage system 730 may be implemented as a single storage device but may also be implemented across multiple storage devices or sub-systems co-located or distributed relative to each other. Storage system 730 may include additional elements, such as a controller, capable of communicating with processing system 710.

Software 720, including that supporting luminaire platform 745, may be implemented in program instructions and among other functions may, when executed by system 700 in general or processing system 710 in particular, direct the system 700 or processing system 710 to operate as described herein for the luminaire platform 745 (and its various components and functionality).

System 700 may represent any computing system on which software 720 may be staged and from where software 720 may be distributed, transported, downloaded, or otherwise provided to yet another computing system for deployment and execution, or yet additional distribution.

In embodiments where the system 700 includes multiple computing devices, the server can include one or more communications networks that facilitate communication among the computing devices. For example, the one or more communications networks can include a local or wide area network that facilitates communication among the computing devices. One or more direct communication links can be included between the computing devices. In addition, in some cases, the computing devices can be installed at geographically distributed locations. In other cases, the multiple computing devices can be installed at a single geographic location, such as a server farm or an office.

A network/communication interface 750 may be included, providing communication connections and devices that allow for communication between system 700 and other computing systems (not shown) over a communication network or collection of networks (not shown) or the air.

Certain techniques set forth herein with respect to the application and/or luminaire platform may be described in the general context of computer-executable instructions, such as program modules, executed by one or more computing devices. Generally, program modules include routines, programs, objects, components, and data structures that perform particular tasks or implement particular abstract data types.

Alternatively, or in addition, the functionality, methods and processes described herein can be implemented, at least in part, by one or more hardware modules (or logic components). For example, the hardware modules can include, but are not limited to, application-specific integrated circuit (ASIC) chips, field programmable gate arrays (FPGAs), system-on-a-chip (SoC) systems, complex programmable logic devices (CPLDs) and other programmable logic devices now known or later developed. When the hardware modules are activated, the hardware modules perform the functionality, methods and processes included within the hardware modules.

Embodiments may be implemented as a computer process, a computing system, or as an article of manufacture, such as a computer program product or computer-readable medium. Certain methods and processes described herein can be embodied as software, code and/or data, which may be stored on one or more storage media. Certain embodiments of the invention contemplate the use of a machine in the form of a computer system within which a set of instructions, when executed, can cause the system to perform any one or more of the methodologies discussed above. Certain computer program products may be one or more computer-readable storage media readable by a computer system (and executable by a processing system) and encoding a computer program of instructions for executing a computer process. It should be understood that as used herein, in no case do the terms "storage media", "computer-readable storage media" or "computer-readable storage medium" consist of transitory propagating signals.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

What is claimed is:

1. A method comprising:
   receiving a request, the request comprising luminaire information and a user type;
   determining one or more luminaires satisfying one or more criterion with respect to the luminaire information;
   determining a set of attributes based on the user type, wherein the set of attributes comprises attributes of a luminaire that a user can access based on the user type;
   obtaining an associated set of attributes for each of the determined one or more luminaires based on the determined set of attributes accessible by the user type; and
   providing the associated set of attributes for each of the determined one or more luminaires for display.

2. The method of claim 1, wherein the luminaire information comprises an image of a luminaire.

3. The method of claim 2, wherein the method further comprises:
   extracting parameters for the luminaire information from the image of the luminaire by performing image analysis or optical character recognition on the image.

4. The method of claim 1, wherein the luminaire information comprises one or more selected attributes, the one or more selected attributes being selected from the attributes of the luminaire that the user can access based on the user type.

5. The method of claim 1, wherein the luminaire information comprises spreadsheet information, wherein the spreadsheet information comprises one or more attributes of the set of attributes.

6. The method of claim 5, wherein providing the one or more luminaires and the associated set of attributes for display comprises automatically filling a spreadsheet having the spreadsheet information with any missing attributes of the associated set of attributes.

7. The method of claim 1, wherein the luminaire information comprises photometric data of a photometric file.

8. The method of claim 1, wherein determining the one or more luminaires satisfying the one or more criterion with respect to the luminaire information comprises querying a structured data resource for the one or more luminaires using the luminaire information.

9. The method of claim 1, wherein obtaining each attribute of the associated set of attributes comprises retrieving one or more attributes from a structured data resource storing previously obtained attributes.

10. The method of claim 1, wherein obtaining each attribute of the associated set of attributes comprises calculating one or more attributes using other attributes.

11. The method of claim 1, further comprising:
    obtaining one or more user preferences, wherein the one or more user preferences comprise current regulation information, price preferences, energy efficiency preferences, or a combination thereof; and ranking the one or more luminaires based on the one or more user preferences.

12. The method of claim 1, wherein the one or more luminaires comprise two or more luminaires, the two or more luminaires being provided for a comparison display using a consistent format and terminology.

13. A computer readable storage medium having instructions stored thereon that, when executed by a processor, perform a method comprising:
  receiving a request, the request comprising luminaire information and a user type;
  determining one or more luminaires satisfying one or more criterion with respect to the luminaire information;
  determining a set of attributes based on the user type, wherein the set of attributes comprises attributes of a luminaire that a user can access based on the user type;
  obtaining an associated set of attributes for each of the determined one or more luminaires based on the determined set of attributes accessible by the user type; and
  providing the associated set of attributes for each of the determined one or more luminaires for display.

14. The medium of claim 13, wherein the luminaire information comprises an image of a luminaire, wherein the method further comprises:
  extracting parameters for the luminaire information from the image of the luminaire by performing image analysis or optical character recognition on the image.

15. The medium of claim 13, wherein the luminaire information comprises spreadsheet information, the spreadsheet information comprising one or more attributes of the set of attributes, wherein providing the one or more luminaires and the associated set of attributes for display comprises automatically filling a spreadsheet having the spreadsheet information with any missing attributes of the associated set of attributes.

16. The medium of claim 13, wherein determining the one or more luminaires satisfying the one or more criterion with respect to the luminaire information comprises querying a structured data resource for the one or more luminaires using the luminaire information.

17. The medium of claim 13, wherein obtaining each attribute of the associated set of attributes comprises retrieving one or more attributes from a structured data resource storing previously obtained attributes.

18. The medium of claim 13, wherein obtaining each attribute of the associated set of attributes comprises calculating one or more attributes using other attributes.

19. The medium of claim 13, wherein the one or more luminaires comprise two or more luminaires, the two or more luminaires being provided for a comparison display using a consistent format and terminology.

20. A system comprising:
  a processing system;
  a storage system; and
  instructions stored on the storage system that, when executed by the processing system, direct the processing system to:
    receive a request, the request comprising luminaire information and a user type;
    determine one or more luminaires satisfying one or more criterion with respect to the luminaire information;
    determine a set of attributes based on the user type, wherein the set of attributes comprises attributes of a luminaire that a user can access based on the user type;
    obtain an associated set of attributes for each of the determined one or more luminaires based on the determined set of attributes accessible by the user type; and
    provide the associated set of attributes for each of the determined one or more luminaires for display.

* * * * *